United States Patent
Pasquale et al.

(10) Patent No.: US 12,421,602 B2
(45) Date of Patent: Sep. 23, 2025

(54) MULTI-STATION SEMICONDUCTOR PROCESSING WITH INDEPENDENTLY ADJUSTABLE PEDESTALS

(71) Applicant: Lam Research Corporation, Fremont, CA (US)

(72) Inventors: Frank Loren Pasquale, Tigard, OR (US); Jennifer Leigh Petraglia, Portland, OR (US); Dinesh Baskar, Portland, OR (US); Adrien LaVoie, Newberg, OR (US)

(73) Assignee: Lam Research Corporation, Fremont, CA (US)

( * ) Notice: Subject to any disclaimer, the term of this patent is extended or adjusted under 35 U.S.C. 154(b) by 53 days.

(21) Appl. No.: 17/593,106

(22) PCT Filed: Mar. 6, 2020

(86) PCT No.: PCT/US2020/021323
§ 371 (c)(1),
(2) Date: Sep. 9, 2021

(87) PCT Pub. No.: WO2020/185539
PCT Pub. Date: Sep. 17, 2020

(65) Prior Publication Data
US 2022/0136104 A1 May 5, 2022

Related U.S. Application Data

(60) Provisional application No. 62/817,332, filed on Mar. 12, 2019.

(51) Int. Cl.
*C23C 16/455* (2006.01)
*C23C 16/458* (2006.01)

(52) U.S. Cl.
CPC .. *C23C 16/45544* (2013.01); *C23C 16/45536* (2013.01); *C23C 16/4583* (2013.01)

(58) Field of Classification Search
CPC .......... C23C 16/4583; C23C 16/45544; C23C 16/45536; C23C 16/4587; C23C 16/458; C23C 16/45546
See application file for complete search history.

(56) References Cited

U.S. PATENT DOCUMENTS 8,715,418 B2    5/2014   Chen
9,214,333 B1    12/2015  Sims et al.
(Continued)

FOREIGN PATENT DOCUMENTS

CN    107419238 A    12/2017
JP    2015220458 A   12/2015
(Continued)

OTHER PUBLICATIONS

International Preliminary Report on Patentability dated Sep. 23, 2021 in PCT/US2020/021323.
(Continued)

*Primary Examiner* — Joseph A Miller, Jr.
(74) *Attorney, Agent, or Firm* — Weaver Austin Villeneuve & Sampson LLP

(57) ABSTRACT

Methods and apparatuses for depositing material onto substrates in a multi-station deposition apparatus having a first station and a second station are provided. One method may include providing a first substrate onto a first pedestal of the first station, providing a second substrate onto a second pedestal of the second station, and for a first part of a deposition process, simultaneously generating a first plasma at the first station while the first pedestal is separated by a first distance from a first showerhead of the first station, thereby depositing a first layer of material onto the first (Continued)

substrate, and a second plasma at the second station while the second pedestal is separated by a second distance from a second showerhead of the second station, thereby depositing a second layer of material onto the second substrate, in which the first distance is different than the second distance.

24 Claims, 16 Drawing Sheets

(56) References Cited

U.S. PATENT DOCUMENTS

| | | | |
|---|---|---|---|
| 9,508,547 B1 | 11/2016 | Pasquale et al. | |
| 2006/0144334 A1 | 7/2006 | Yim et al. | |
| 2008/0179181 A1 | 7/2008 | Collins et al. | |
| 2008/0206483 A1 | 8/2008 | Paterson et al. | |
| 2008/0236490 A1 | 10/2008 | Paterson et al. | |
| 2009/0206056 A1 | 8/2009 | Xu et al. | |
| 2012/0068162 A1* | 3/2012 | Mandlik | C23C 16/401 428/447 |
| 2012/0180954 A1 | 7/2012 | Yang et al. | |
| 2015/0249013 A1 | 9/2015 | Arghavani et al. | |
| 2015/0249028 A1 | 9/2015 | Genetti et al. | |
| 2015/0332912 A1 | 11/2015 | Nowak et al. | |
| 2017/0314129 A1* | 11/2017 | Karim | C23C 16/52 |
| 2018/0151336 A1 | 5/2018 | Sakka et al. | |
| 2018/0290168 A1* | 10/2018 | Han | C23C 16/45565 |
| 2018/0350670 A1 | 12/2018 | Spurlin et al. | |
| 2021/0090962 A1* | 3/2021 | Kapoor | H01L 21/67253 |

FOREIGN PATENT DOCUMENTS

| | | | |
|---|---|---|---|
| JP | 2017199904 A | 11/2017 | |
| KR | 20170124074 A | 11/2017 | |
| TW | 201440153 A | 10/2014 | |
| TW | 201534752 A | 9/2015 | |
| TW | 201717253 A | 5/2017 | |
| TW | 201907051 A | 2/2019 | |
| WO | WO-2006101857 A2 | 9/2006 | |
| WO | WO-2009102687 A1 | 8/2009 | |

OTHER PUBLICATIONS

International Search report and Written Opinion dated Jul. 2, 2020, issued in PCT/US2020/021323.
CN Office Action dated Mar. 9, 2023, in Application No. CN202080035213.1 with English translation.
CN Office Action dated Oct. 17, 2023, in Application No. CN202080035213.1 with English translation.
SG Search report and Written Opinion dated Jun. 27, 2023 in Application No. SG11202109959T.
TW Office Action dated Dec. 5, 2023 in TW Application No. 109107774 with English Translation.
JP Office Action dated Mar. 5, 2024 in JP Application No. 2021554600 with English Translation.
SG Written Opinion dated Apr. 12, 2024 in SG Application No. 11202109959T.
JP Office Action dated Jul. 30, 2024 in JP Application No. 2021-554600, with English Translation.
JP Office Action dated Dec. 3, 2024 in JP Application No. 2021-554600 with English translation.
KR Office Action dated Mar. 4, 2025 in KR Application No. 10-2021-7032633, with English Translation.

\* cited by examiner

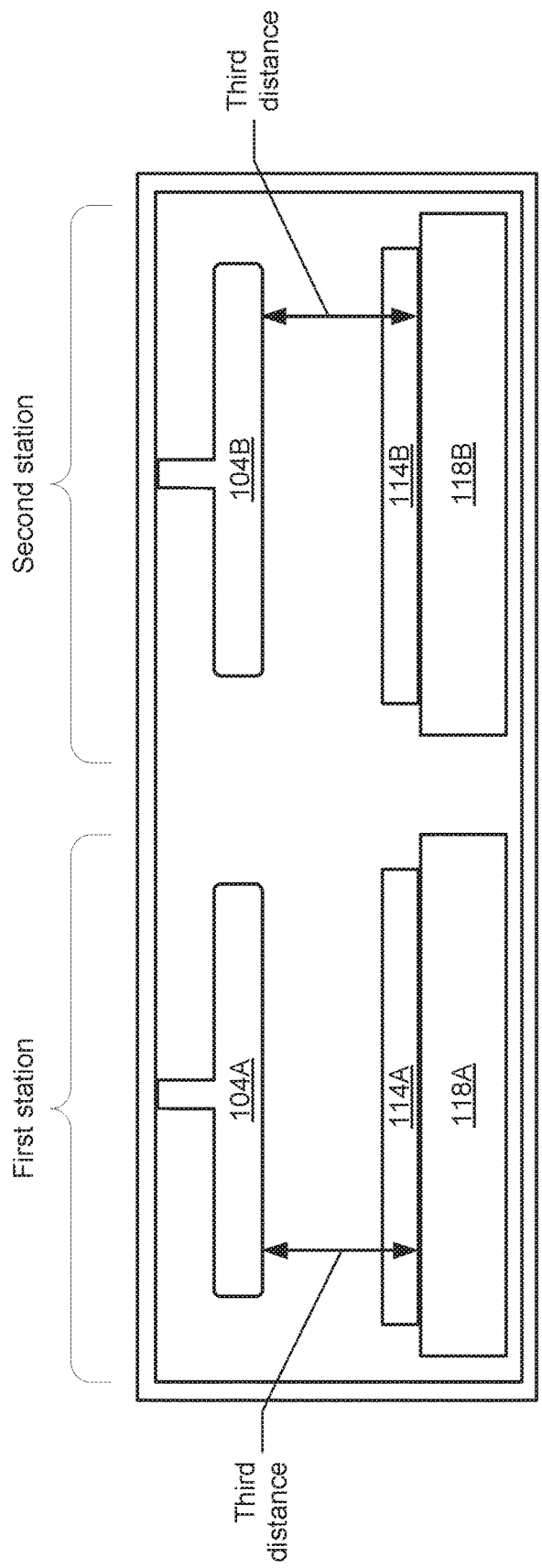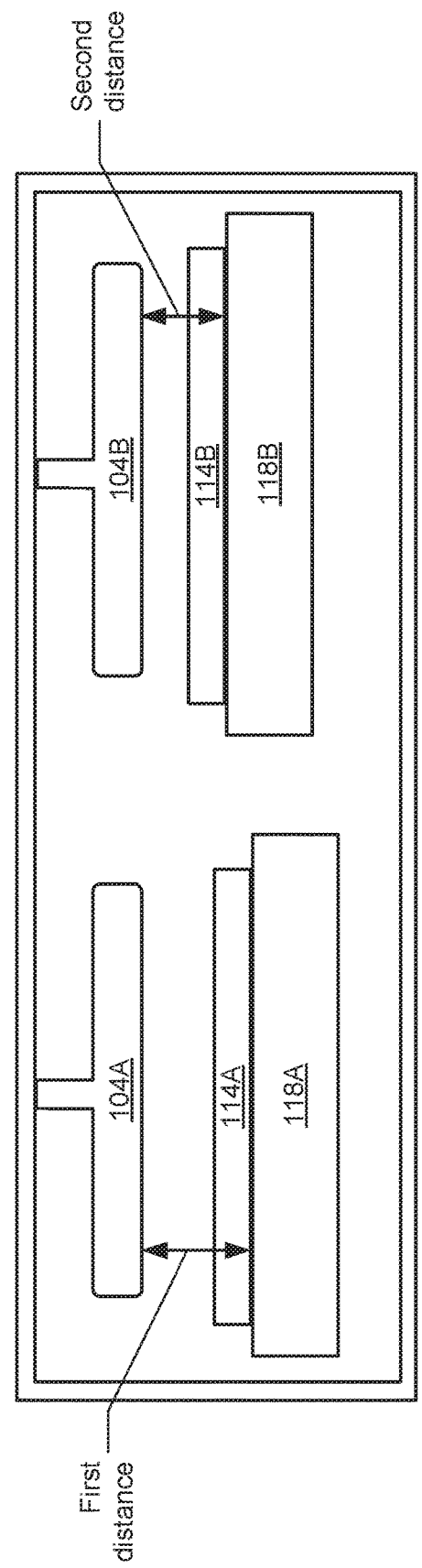

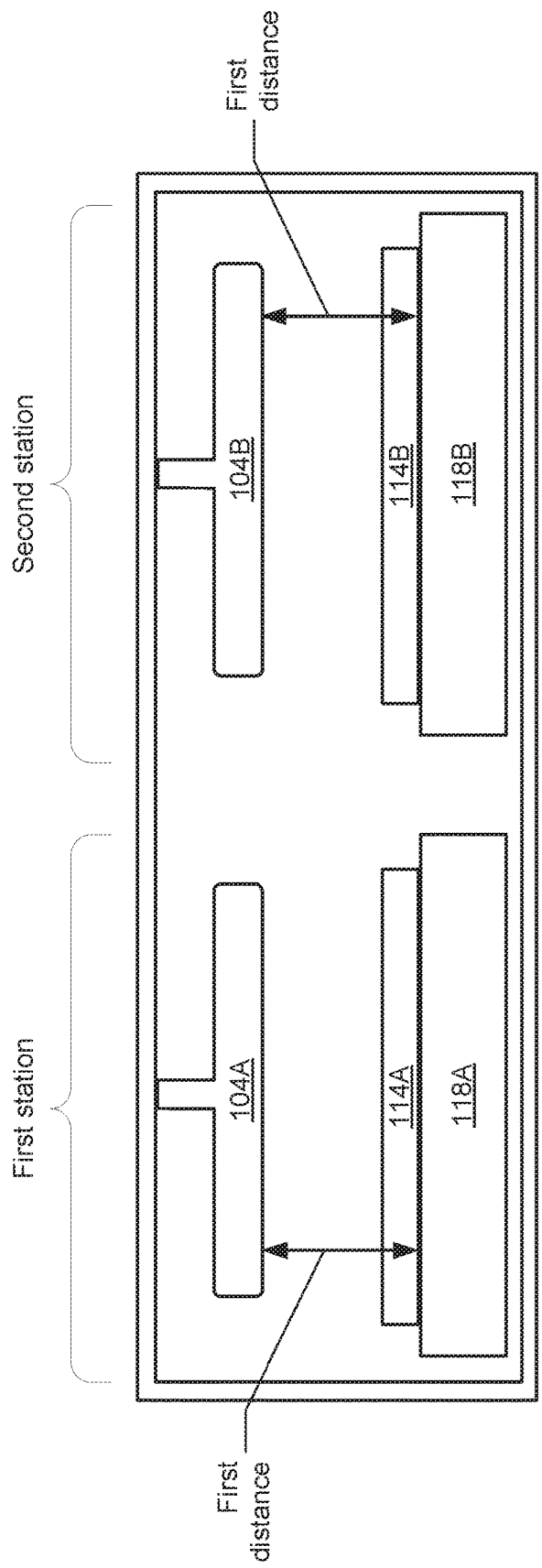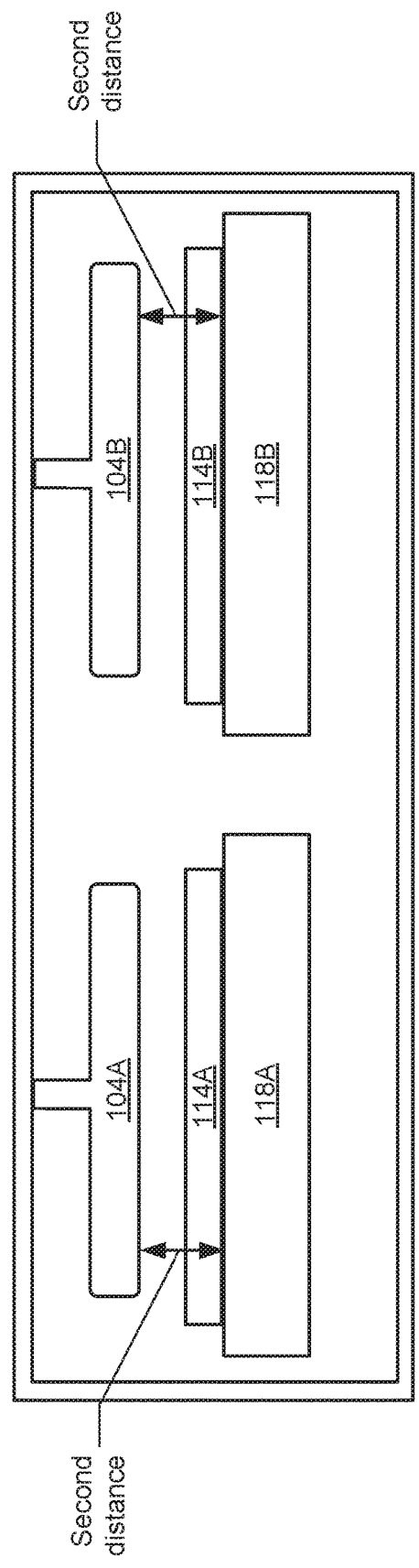
Figure 10D
Figure 10E

MULTI-STATION SEMICONDUCTOR PROCESSING WITH INDEPENDENTLY ADJUSTABLE PEDESTALS

INCORPORATION BY REFERENCE

A PCT Request Form is filed concurrently with this specification as part of the present application. Each application that the present application claims benefit of or priority to as identified in the concurrently filed PCT Request Form is incorporated by reference herein in its entirety and for all purposes.

BACKGROUND

During semiconductor processing operations, a substrate is typically supported on a pedestal within a processing chamber and a plasma may be used to deposit one or more layers of material onto the substrate. In commercial scale manufacturing, each substrate, or wafer, contains many copies of a particular semiconductor device being manufactured, and many substrates are required to achieve the required volumes of devices. The commercial viability of a semiconductor processing operation depends in large part upon within-wafer uniformity and wafer-to-wafer repeatability of the process conditions. Accordingly, efforts are made to ensure that each portion of a given wafer and each wafer processed are exposed to the same processing conditions. Variation in the processing conditions and the semiconductor processing tool can cause variations in deposition conditions resulting in unacceptable variation in the overall process and product. Techniques and apparatus to minimize process variation are required.

SUMMARY

The systems, methods and devices of this disclosure each have several innovative aspects, no single one of which is solely responsible for the desirable attributes disclosed herein. Included among these aspects are at least the following implementations, although further implementations may be set forth in the detailed description or may be evident from the discussion provided herein.

In some embodiments, a method of depositing material onto substrates in a multi-station deposition apparatus having a first station and a second station may be provided. The method may include providing a first substrate onto a first pedestal of the first station, providing a second substrate onto a second pedestal of the second station, and for a first part of a deposition process, simultaneously generating a first plasma at the first station while the first pedestal is separated by a first distance from a first showerhead of the first station, thereby depositing a first layer of material onto the first substrate, and a second plasma at the second station while the second pedestal is separated by a second distance from a second showerhead of the second station, thereby depositing a second layer of material onto the second substrate, in which the first distance is different than the second distance.

In some embodiments, the method may further include simultaneously generating, for a second part of the deposition process a third plasma at the first station while the first pedestal is separated by a third distance from the first showerhead, thereby depositing a third layer of material onto the first substrate, in which the first distance is different than the third distance, and a fourth plasma at the second station while the second pedestal is separated by a fourth distance from the second showerhead, thereby depositing a fourth layer of material onto the second substrate, in which the second distance is different than the fourth distance.

In some such embodiments, the difference between the first distance and the third distance may be substantially the same as the difference between the second distance and the fourth distance.

In some embodiments, the method may further include simultaneously generating for a second layer of the deposition process a third plasma at the first station while the first pedestal is separated by a third distance from the first showerhead, thereby depositing a third layer of material onto the first substrate, and a fourth plasma at the second station while the second pedestal is separated by the third distance from the second showerhead, thereby depositing a fourth layer of material onto the second substrate.

In some embodiments, the first part includes N deposition cycles, and each of the N deposition cycles includes simultaneously generating the first plasma at the first station while the first pedestal is separated by the first distance thereby depositing the first layer of material onto the first substrate, and the second plasma at the second station while the second pedestal is separated by the second distance thereby depositing the second layer of material onto the second substrate, and igniting and extinguishing the first plasma and the second plasma.

In some such embodiments, the method may further include for a second part of the deposition process, after the first part, that includes X deposition cycles, simultaneously generating in each of the X deposition cycles a third plasma at the first station while the first pedestal is separated by a third distance from the first showerhead, thereby depositing a third layer of material onto the first substrate, and a fourth plasma at the second station while the second pedestal is separated by the third distance from the second showerhead, thereby depositing a fourth layer of material onto the second substrate, in which each of the X deposition cycles includes igniting and extinguishing the third plasma and the fourth plasma.

In some such embodiments, the method may further include for a second part of the deposition process, before the first part, that includes Y deposition cycles, simultaneously generating in each of the Y deposition cycles a third plasma at the first station while the first pedestal is separated by a third distance from the first showerhead, thereby depositing a third layer of material onto the first substrate, and a fourth plasma at the second station while the second pedestal is separated by the third distance from the second showerhead, thereby depositing a fourth layer of material onto the second substrate, in which each of the Y deposition cycles includes igniting and extinguishing the third plasma and the fourth plasma.

In some such embodiments, the method may further include adjusting the first pedestal between the first distance and a third distance, adjusting the second pedestal between the second distance and a fourth distance, and for a second part of the deposition process that includes Z deposition cycles, simultaneously generating in each of the Z deposition cycles a third plasma at the first station while the first pedestal is separated by the third distance from the first showerhead, thereby depositing a third layer of material onto the first substrate, and a fourth plasma at the second station while the second pedestal is separated by the fourth distance from the second showerhead, thereby depositing a fourth layer of material onto the second substrate, in which each of the Z deposition cycles includes igniting and extinguishing the third plasma and the fourth plasma.

In some such embodiments, each N deposition cycle at the first station and the second station may include (i) adsorbing a film precursor onto the substrate at that station such that the precursor forms an adsorption-limited layer on the substrate, (ii) removing at least some unadsorbed film precursor from the volume surrounding the adsorbed precursor, (iii) reacting adsorbed film precursor, after removing unadsorbed precursor in (ii), by generating the plasma at that station to form the layer of material on the substrate at that station, and (iv) removing desorbed film precursor and/or reaction by-product from the volume surrounding the film layer when present after reacting the adsorbed precursor.

In some further such embodiments, the method may further include adjusting the first pedestal from the first distance to a third distance, and adjusting the second pedestal from the second distance to a fourth distance, in which the first pedestal may be at the first distance and the second pedestal is at the second distance for (iii) of each cycle, and the first pedestal may be at the third distance and the second pedestal is at the fourth distance for one or more of (i), (ii), or (iv) of each cycle.

In some embodiments, the method may further include providing a third substrate onto a third pedestal of the third station of the multi-station deposition apparatus. The first part of the deposition process may further include simultaneously generating a third plasma at the third station while the third pedestal is separated by a third distance from a third showerhead of the third station, thereby depositing a third layer of material onto the third substrate, in which the third distance may be different than the first distance and the second distance.

In some such embodiments, the method may further include for a second part of the deposition process, simultaneously generating a fourth plasma at the first station while the first pedestal is separated by a fourth distance from the first showerhead, thereby depositing a fourth layer of material onto the first substrate, a fifth plasma at the second station while the second pedestal is separated by the fourth distance from the second showerhead, thereby depositing a fifth layer of material onto the second substrate, and a sixth plasma at the third station while simultaneously generating the fourth plasma and the fifth plasma, and while the third pedestal is separated by the fourth distance from the third showerhead, thereby depositing a sixth layer of material onto the third substrate.

In some embodiments, the first plasma may have a first value of a plasma characteristic, and the second plasma may have a second value of the plasma characteristic different than the first value.

In some such embodiments, the plasma characteristic may include a plasma power.

In some embodiments, the first layer of material on the first substrate may have a first value of a property, and the second layer of material on the second substrate may have a second value of the property substantially the same as the first value.

In some embodiments, the first layer of material on the first substrate may have a first value of a property, and the second layer of material on the second substrate may have a second value of the property different than the first value.

In some such embodiments, the property may be a wet etch rate, a dry etch rate, a composition, a thickness, a density, an amount of cross-linking, a chemistry, a reaction completion, a stress, a refractive index, a dielectric constant, a hardness, an etch selectivity, a stability, and a hermeticity.

In some embodiments, the first layer of material on the first substrate may have a first value of a property, and the second layer of material on the second substrate may have the first value of the property.

In some embodiments, the method may further include providing, before providing the first substrate and the second substrate, a third substrate onto the first pedestal, providing, before providing the first substrate and the second substrate, a fourth substrate onto the second pedestal, and for a second deposition process, simultaneously generating a third plasma at the first station while the first pedestal is separated by a third distance from the first showerhead, thereby depositing a third layer of material onto the third substrate, and a fourth plasma at the second station while the second pedestal is separated by the first distance from the second showerhead, thereby depositing a fourth layer of material onto the fourth substrate, in which a first nonuniformity between a property of the first layer of material on the first substrate and the property of the second layer of material on the second substrate is smaller than a second nonuniformity between the property of the third layer of material on the third substrate and the property of the fourth layer of material on the fourth substrate.

In some embodiments, the first pedestal may apply a chucking force on the first substrate during the first part of the deposition process, and the second pedestal may apply a chucking force on the second substrate during the first part of the deposition process.

In some embodiments, a method of depositing material onto substrates in a multi-station deposition apparatus having a first station and a second station may be provided. The method may include providing a first substrate onto a first pedestal of the first station, providing a second substrate onto a second pedestal of the second station, for a first part of a deposition process, simultaneously generating a first plasma at the first station while the first pedestal is separated by a first distance from a first showerhead of the first station, thereby depositing a first layer of material onto the first substrate, and a second plasma at the second station while the second pedestal is separated by the first distance from a second showerhead of the second station, thereby depositing a second layer of material onto the second substrate. The method may further include adjusting, after the first part, the first pedestal to a second distance and the second pedestal to the second distance and for a second part of the deposition process, simultaneously generating a third plasma at the first station while the first pedestal is separated by the second distance, thereby depositing a third layer of material onto the first substrate and a fourth plasma at the second station while the second pedestal is separated by the second distance, thereby depositing a fourth layer of material onto the second substrate.

In some such embodiments, the first layer of material on the first substrate may have a first value of a property, the second layer of material on the second substrate may have a second value of the property, the third layer of material on the first substrate may have a third value of the property different than the first value, and the second layer of material on the second substrate may have a fourth value of the property different than the second value.

In some such embodiments, the first distance may be larger than the second distance.

In some embodiments, a multi-station deposition apparatus may be provided. The apparatus may include a processing chamber, a first process station in the processing chamber that includes a first showerhead and a first pedestal configured to be moved vertically with respect to the first showerhead, a second process station in the processing chamber that includes a second showerhead and a second pedestal configured to be moved vertically with respect to the second showerhead, and a controller for controlling the multi-station deposition apparatus to deposit a material onto substrates at the first and second stations, the controller comprising control logic for providing a first substrate to the first pedestal, providing a second substrate to the second pedestal, moving the first pedestal so that it is separated by a first distance from the first showerhead, moving the second pedestal so that it is separated by a second distance from the second showerhead, and simultaneously generating a first plasma at the first station while the first pedestal is separated by the first distance from the first showerhead, thereby depositing a first layer of material onto the first substrate, and a second plasma at the second station while the second pedestal is separated by the second distance from the second showerhead, thereby depositing a second layer of material onto the second substrate, in which the first distance may be different than the second distance.

In some such embodiments, the controller may further include control logic for moving the first pedestal so that it is separated by a third distance from the first showerhead, moving the second pedestal so that it is separated by fourth distance from the second showerhead, and simultaneously generating a third plasma at the first station while the first pedestal is separated by the third distance from the first showerhead, thereby depositing a third layer of material onto the first substrate, and a fourth plasma at the second station while the second pedestal is separated by the fourth distance from the second showerhead, thereby depositing a fourth layer of material onto the second substrate.

In some such embodiments, the third distance may be different than the fourth distance.

In some such embodiments, the third distance may be the same as the fourth distance.

In some further such embodiments, the controller may further include control logic for simultaneously generating the third plasma at the third station and the fourth plasma at the fourth station before simultaneously generating the first plasma at the first station and the second plasma at the second station.

In some further such embodiments, the controller may further include control logic for simultaneously generating the third plasma at the third station and the fourth plasma at the fourth station after simultaneously generating the first plasma at the first station and the second plasma at the second station.

In some embodiments, the first pedestal may be configured to apply a chucking force on the first substrate, the second pedestal may be configured to apply a chucking force on the second substrate, and the controller may further include control logic for causing, during the first part of the deposition process, the first pedestal to apply the chucking force on the first substrate and the second pedestal to apply the chucking force on the second substrate.

In some such embodiments, the first and second chucking forces may be electrostatic forces.

In some such embodiments, the first and second chucking forces may be exerted by a vacuum.

In some embodiments, a multi-station deposition apparatus may be provided. The apparatus may include a processing chamber, a first process station in the processing chamber that includes a first showerhead and a first pedestal configured to be moved vertically with respect to the first showerhead, a second process station in the processing chamber that includes a second showerhead and a second pedestal configured to be moved vertically with respect to the second showerhead, and a controller for controlling the multi-station deposition apparatus to deposit a material onto substrates at the first and second stations, the controller comprising control logic for providing a first substrate to the first pedestal, providing a second substrate to the second pedestal, moving the first pedestal so that it is separated by a first distance from the first showerhead, moving the second pedestal so that it is separated by the first distance from the second showerhead, and simultaneously generating a first plasma at the first station while the first pedestal is separated by the first distance from the first showerhead, thereby depositing a first layer of material onto the first substrate, and a second plasma at the second station while the second pedestal is separated by the first distance from the second showerhead, thereby depositing a second layer of material onto the second substrate. The method may further include moving, after simultaneously generating the first plasma and the second plasma, the first pedestal so that it is separated by a second distance from the first showerhead, moving, after simultaneously generating the first plasma and the second plasma, the second pedestal so that it is separated by the second distance from the first showerhead, and simultaneously generating a third plasma at the first station while the first pedestal is separated by the second distance from the first showerhead, thereby depositing a third layer of material onto the first substrate, and a fourth plasma at the second station while the second pedestal is separated by the second distance from the second showerhead, thereby depositing a fourth layer of material onto the second substrate.

In some such embodiments, the first distance may be larger than the second distance.

In some embodiments, a multi-station deposition apparatus may be provided. The apparatus may include a processing chamber, a first process station in the processing chamber that includes a first showerhead and a first pedestal configured to be moved vertically with respect to the first showerhead, and a second process station in the processing chamber that includes a second showerhead and a second pedestal configured to be moved vertically with respect to the second showerhead. The first pedestal may be separated from the first showerhead by a first distance, and the second pedestal may be separated from the second showerhead by a second distance different than the first distance.

In some embodiments, the apparatus may further include a third process station in the processing chamber that includes a third showerhead and a third pedestal configured to be moved vertically with respect to the third showerhead, in which the third pedestal is separated from the third showerhead by a third distance that is same as the first distance.

In some such embodiments, the apparatus may further include a fourth process station in the processing chamber that includes a fourth showerhead and a fourth pedestal configured to be moved vertically with respect to the fourth showerhead, in which the fourth pedestal is separated from the fourth showerhead by a fourth distance that is different than the first distance, the second distance, and the third distance.

In some such embodiments, the apparatus may further include a fourth process station in the processing chamber that includes a fourth showerhead and a fourth pedestal configured to be moved vertically with respect to the fourth showerhead, in which the fourth pedestal is separated from the fourth showerhead by a fourth distance that is the same as the first distance or the second distance.

In some embodiments, the apparatus may further include a third process station in the processing chamber that includes a third showerhead and a third pedestal configured to be moved vertically with respect to the third showerhead, in which the third pedestal is separated from the third showerhead by a third distance that is different than the first distance and the second distance.

In some such embodiments, the apparatus may further include a fourth process station in the processing chamber that includes a fourth showerhead and a fourth pedestal configured to be moved vertically with respect to the fourth showerhead, in which the fourth pedestal is separated from the fourth showerhead by a fourth distance that is different than the first distance, the second distance, and the third distance.

In some such embodiments, the apparatus may further include a fourth process station in the processing chamber that includes a fourth showerhead and a fourth pedestal configured to be moved vertically with respect to the fourth showerhead, in which the fourth pedestal is separated from the fourth showerhead by a fourth distance that is the same as the first distance, the second distance, or the third distance.

In some embodiments, a method of depositing material onto substrates in a multi-station deposition apparatus having a first station and a second station may be provided. The method may include providing a first substrate onto a first pedestal of the first station, providing a second substrate onto a second pedestal of the second station, and for a first part of a deposition process, simultaneously flowing a precursor onto the first substrate at the first station while the first pedestal is separated by a first distance from a first showerhead of the first station, and onto the second substrate at the second station while the second pedestal is separated by a second distance from a second showerhead of the second station, in which the first distance is different than the second distance.

In some embodiments, the method may further include simultaneously flowing, for a second part of the deposition process, the precursor onto the first substrate at the first station while the first pedestal is separated by a third distance from the first showerhead, and onto the second substrate at the second station while the second pedestal is separated by a fourth distance from the second showerhead, in which the second distance is different than the fourth distance.

In some such embodiments, the first part may include N deposition cycles, and each of the N deposition cycles may include simultaneously flowing the precursor onto the first substrate at the first station while the first pedestal is separated by the first distance and onto the second substrate at the second station while the second pedestal is separated by the second distance.

In some further such embodiments, the method may further include for a second part of the deposition process that includes P deposition cycles, simultaneously flowing the precursor in each of the P deposition cycles onto the first substrate at the first station while the first pedestal is separated by a third distance from the first showerhead, and onto the second substrate at the second station while the second pedestal is separated by a fourth distance from the second showerhead.

In some further such embodiments, the method may further include for a second part of the deposition process, after the first part, that includes X deposition cycles, simultaneously flowing the precursor in each of the X deposition cycles onto the first substrate at the first station while the first pedestal is separated by a third distance from the first showerhead, and onto the second substrate at the second station while the second pedestal is separated by the third distance from the second showerhead.

In some further such embodiments, the method may further include for a second part of the deposition process, before the first part, that includes Y deposition cycles, simultaneously flowing the precursor in each of the Y deposition cycles onto the first substrate at the first station while the first pedestal is separated by a third distance from the first showerhead, and onto the second substrate at the second station while the second pedestal is separated by the third distance from the second showerhead.

In some embodiments, a method of depositing material onto substrates in a multi-station deposition apparatus having a first station and a second station may be provided. The method may include providing a first substrate onto a first pedestal of the first station, providing a second substrate onto a second pedestal of the second station, for a first part of a deposition process, simultaneously flowing a precursor onto the first substrate at the first station while the first pedestal is separated by a first distance from a first showerhead of the first station, and onto the second substrate at the second station while the second pedestal is separated by the first distance from a second showerhead of the second station. The method may further include adjusting, after the first part, the first pedestal to a second distance and the second pedestal to the second distance, and for a second part of the deposition process, simultaneously flowing the precursor onto the first substrate at the first station while the first pedestal is separated by the second distance, and onto the second substrate at the second station while the second pedestal is separated by the second distance.

In some embodiments, a method of depositing material onto substrates in a multi-station deposition apparatus having a first station and a second station may be provided. The method may include providing a first substrate onto a first pedestal of the first station, providing a second substrate onto a second pedestal of the second station, and for a first part of a deposition process, simultaneously generating a first plasma at the first station and concurrently flowing a precursor onto the first substrate while the first pedestal is separated by a first distance from a first showerhead of the first station, thereby depositing a first layer of material onto the first substrate, and generating a second plasma at the second station and concurrently flowing the precursor onto the second substrate while the second pedestal is separated by a second distance from a second showerhead of the second station, thereby depositing a second layer of material onto the second substrate, in which the first distance is different than the second distance.

BRIEF DESCRIPTION OF THE DRAWINGS

The various implementations disclosed herein are illustrated by way of example, and not by way of limitation, in the figures of the accompanying drawings, in which like reference numerals refer to similar elements.

FIGS. 10A-10E depict example sequences of pedestal movement in an example multi-station processing chamber.

DETAILED DESCRIPTION

Figure 1:
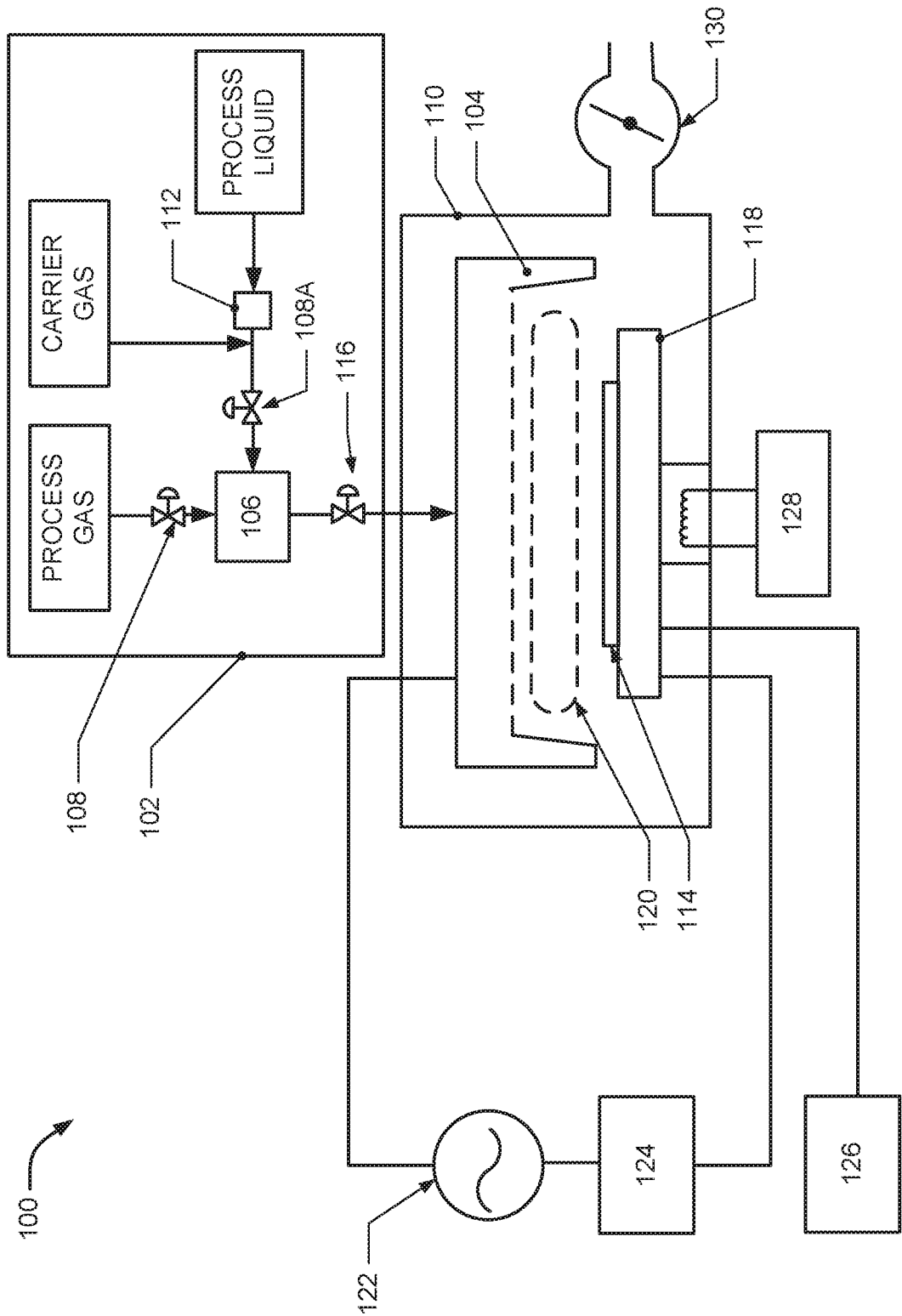
FIG. 1 depicts a substrate processing apparatus for depositing films on semiconductor substrates using any number of processes.

In this application, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication thereon. A wafer or substrate used in the semiconductor device industry typically has a diameter of 200 mm, or 300 mm, or 450 mm. The following detailed description assumes the invention is implemented for use with such a wafer. However, the invention is not so limited. The work piece may be of various shapes, sizes, and materials. In addition to semiconductor wafers, other work pieces that may take advantage of this invention include various articles such as printed circuit boards, magnetic recording media, magnetic recording sensors, mirrors, optical elements, micro-mechanical devices and the like.

Described herein techniques and apparatuses may improve station-to-station matching of various deposited material properties by adjusting the gap between the pedestal and the showerhead during plasma generation. In many plasma-assisted deposition processes, such as atomic layer deposition (ALD) or plasma-enhanced chemical vapor deposition (PECVD), the showerhead and pedestal are separated by a distance or a gap and a plasma is generated within this gap in order to drive a reaction on the wafer. The distance between the showerhead and pedestal during plasma generation has been found to affect various properties of the material deposited on the substrate, such as material thickness, dry etch rate (DER), and wet etch rate (WER). Changing or independently controlling the distance between the showerhead and the pedestal in multiple stations for a plasma-assisted process may change characteristics of the plasma, such as the plasma power and the features of the plasma sheath at the wafer. The independent control of pedestal height in multiple stations may also impact non-plasma processes such as precursor exposure such as during adsorption-limited processes (e.g., ALD), and gas phase processes such as CVD, including PECVD.

Because of the relationships between the distance and resulting material properties and plasma characteristics, the techniques and apparatuses herein utilize pedestals at different distances relative to a showerhead to adjust properties of deposited materials and reduce station-to-station variations. In some embodiments, differences of a material property between stations can be reduced by changing the showerhead-pedestal gap in order to adjust the material property at one or more stations with respect to one or more other stations, thus tuning the material property at one or more stations. In certain embodiments, the pedestal distance is adjusted during the deposition process (e.g., over the course of depositing a layer by multiple cycles of ALD) to produce film properties having different values throughout the material. For example, the distance may be adjusted during the deposition to cause one section the material to have one value of a property and another section of the material, such as different values of densities, WERs, or DERs, within the material.

1. Example Deposition Apparatuses

Some semiconductor processes are used to deposit one or more layers of a material onto a substrate. Example deposition processes include chemical vapor deposition ("CVD"), plasma-enhanced CVD ("PECVD"), atomic layer deposition ("ALD"), low pressure CVD, ultra-high CVD, physical vapor deposition ("PVD"), and conformal film deposition ("CFD"). Some CVD processes may deposit a film on a wafer surface by flowing one or more gas reactants into a reactor which form film precursors and byproducts. The precursors are transported to the wafer surface where they are adsorbed by the wafer, diffused into the wafer, and deposited on the wafer by chemical reactions, including by the generation of a plasma in PECVD. Some other deposition processes involve multiple film deposition cycles, each producing a "discrete" film thickness. ALD is one such film deposition method, but any technique which puts down thin layers of film and used in a repeating sequential matter may be viewed as involving multiple cycles of deposition.

As device and features size continue to shrink in the semiconductor industry, and also as 3D devices structures become more prevalent in integrated circuit (IC) design, the capability of depositing thin conformal films (films of material having a uniform thickness relative to the shape of the underlying structure, even if non-planar) continues to gain importance. ALD is a film forming technique which is well-suited to the deposition of conformal films due to the fact that a single cycle of ALD only deposits a single thin layer of material, the thickness being limited by the amount of one or more film precursor reactants which may adsorb onto the substrate surface (i.e., forming an adsorption-limited layer) prior to the film-forming chemical reaction itself. Multiple "ALD cycles" may then be used to build up a film of the desired thickness, and since each layer is thin and conformal, the resulting film substantially conforms to the shape of the underlying devices structure. In certain embodiments, each ALD cycle includes the following steps:

1. Exposure of the substrate surface to a first precursor.
2. Purge of the reaction chamber in which the substrate is located.
3. Activation of a reaction of the substrate surface, typically with a plasma and/or a second precursor.
4. Purge of the reaction chamber in which the substrate is located.

The duration of each ALD cycle may typically be less than 25 seconds or less than 10 seconds or less than 5 seconds. The plasma exposure step (or steps) of the ALD cycle may be of a short duration, such as a duration of 1 second or less, for example. The plasma may be of other durations longer than that 1 second, such as 2 seconds, 5 seconds, or 10 seconds, for instance.

FIG. 1 depicts a substrate processing apparatus for depositing films on semiconductor substrates using any number of processes. The apparatus 100 of FIG. 1 has a single processing chamber 110 with a single substrate holder 118 (e.g., a pedestal) in an interior volume which may be maintained under vacuum by vacuum pump 130. Also fluidically coupled to the chamber for the delivery of (for example) film precursors, carrier and/or purge and/or process gases, secondary reactants, etc. is gas delivery system 102 and showerhead 104. Equipment for generating a plasma within the processing chamber is also shown in FIG. 1. The apparatus schematically illustrated in FIG. 1 is commonly for performing ALD, although it may be adapted for performing other film deposition operations such as conventional CVD, particularly plasma enhanced CVD.

Figure 2:
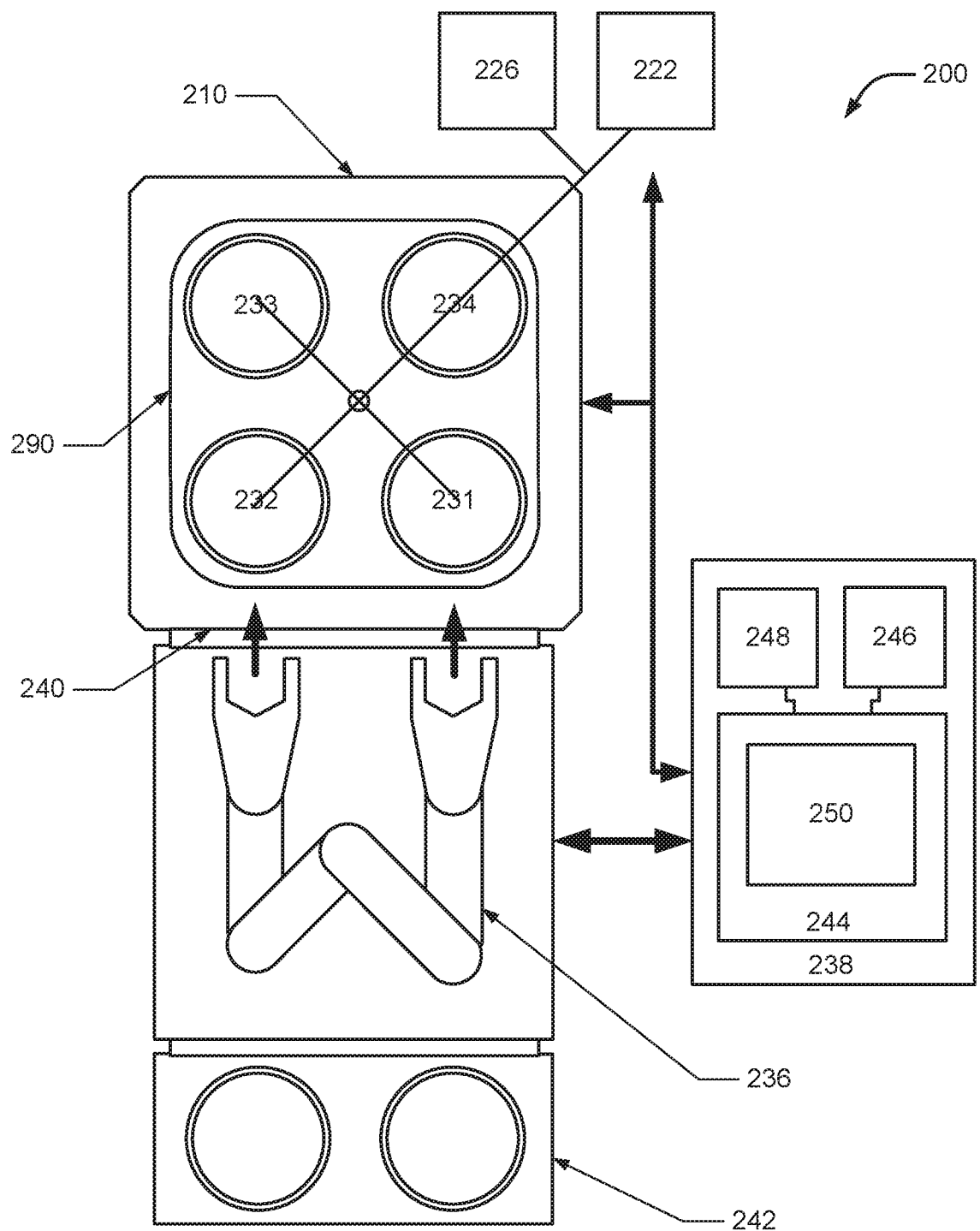
FIG. 2 depicts an implementation of a multi-station processing tool.

For simplicity, processing apparatus 100 is depicted as a standalone process station having a process chamber body 110 for maintaining a low-pressure environment. However, it will be appreciated that a plurality of process stations may be included in a common process tool environment—e.g., within a common reaction chamber—as described herein. For example, FIG. 2 depicts an implementation of a multi-station processing tool and is discussed in further detail below. Further, it will be appreciated that, in some implementations, one or more hardware parameters of processing apparatus 100, including those discussed in detail herein, may be adjusted programmatically by one or more system controllers.

Process station 110 fluidically communicates with gas delivery system 102 for delivering process gases, which may include liquids and/or gases, to a distribution showerhead 104. Gas delivery system 102 includes a mixing vessel 106 for blending and/or conditioning process gases for delivery to showerhead 104. One or more mixing vessel inlet valves 108 and 108A may control introduction of process gases to mixing vessel 106.

Some reactants may be stored in liquid form prior to vaporization and subsequent to delivery to the process chamber 110. The implementation of FIG. 1 includes a vaporization point 112 for vaporizing liquid reactant to be supplied to mixing vessel 106. In some implementations, vaporization point 112 may be a heated liquid injection module. In some other implementations, vaporization point 112 may be a heated vaporizer. In yet other implementations, vaporization point 112 may be eliminated from the process station. In some implementations, a liquid flow controller (LFC) upstream of vaporization point 112 may be provided for controlling a mass flow of liquid for vaporization and delivery to processing chamber 110.

Showerhead 104 distributes process gases and/or reactants (e.g., film precursors) toward substrate 114 at the process station, the flow of which is controlled by one or more valves upstream from the showerhead (e.g., valves 108, 108A, and 116). In the implementation shown in FIG. 1, substrate 114 is located beneath showerhead 104, and is shown resting on the pedestal 118. Showerhead 104 may have any suitable shape, and may have any suitable number and arrangement of ports for distributing processes gases to substrate 114. In some implementations with two or more stations, the gas delivery system 102 includes valves or other flow control structures upstream from the showerhead, which can independently control the flow of process gases and/or reactants to each station such that gas may be flowed to one station but not another. Furthermore, the gas delivery system 102 may be configured to independently control the process gases and/or reactants delivered to each station in a multi-station apparatus such that the gas composition provided to different stations is different; e.g., the partial pressure of a gas component may vary between stations at the same time.

In FIG. 1, showerhead 104 and pedestal 118 are electrically connected to RF power supply 122 and matching network 124 for powering a plasma. In some implementations, the plasma energy may be controlled (e.g., via a system controller having appropriate machine-readable instructions and/or control logic) by controlling one or more of a process station pressure, a gas concentration, an RF source power, an RF source frequency, and a plasma power pulse timing. For example, RF power supply 122 and matching network 124 may be operated at any suitable power to form a plasma having a desired composition of radical species. Likewise, RF power supply 122 may provide RF power of any suitable frequency and power. The apparatus 100 also includes a DC power supply 126 that is configured to provide a direct current to the pedestal, which may be an electrostatic chuck ("ESC") 118 in order to generate and provide an electrostatic clamping force to the ESC 118 and the substrate 114. The pedestal 118 may also have one or more temperature control elements 128 that are configured to heat and/or cool the substrate 114. The pedestal 118 is also configured to be raised and lowered to various heights, or distances, as measured between a pedestal surface and a showerhead. This includes being positioned at different heights during a deposition process. In addition to its movability, the pedestal 118 may also have features like other pedestals, such as a standard pedestal comprised of aluminum or ceramic with heating features configured to head the pedestal to between about 100° C. and 650° C., a coolant pedestal with cooling features configured to cool the pedestal to temperatures less than 100° C., or the like. Some example pedestals are described in U.S. application Ser. No. 11/851,310, titled "PEDESTAL HEAT TRANSFER AND TEMPERATURE CONTROL", filed on Sep. 6, 2007, which is now U.S. Pat. No. 7,941,039, U.S. application Ser. No. 13/467,861, titled "HIGH TEMPERATURE ELECTROSTATIC CHUCK WITH RADIAL THERMAL CHOKES", filed on May 9, 2012, which is now U.S. Pat. No. 9,337,067.

In some embodiments, the pedestal described herein may be configured to hold a wafer in place. This may include the pedestal using a "chuck," which is a device that augments the force of gravity with some other type of clamping force that increases the friction load between the wafer and the pedestal/chuck in order to prevent relative movement between the wafer and the pedestal/chuck. One type of chuck that is used in such operations is an "electrostatic chuck," or ESC. Some ESCs hold a wafer in place by applying a single direct current ("DC") voltage to one or more clamping electrodes within the ESC such that the clamping electrode(s) and the wafer act as a capacitive circuit; the capacitive circuit is completed by the existence of a plasma within the chamber, so this design may be limited to use in processing chambers where plasma environments exist during wafer processing. The clamping electrode(s) are typically thin, planar structures that are parallel to the overall plane of the wafer, and often extend across a region commensurate with the wafer size. The electrostatic force that arises due to the capacitive effect provides the clamping force. Such a configuration may be called "monopolar." Another type of chuck is one that uses gas flow within the pedestal to create a pressure drop, or a vacuum, between the wafer and the pedestal which in turn creates a suction that clamps the wafer against the pedestal. This may be considered a chucking force exerted by a vacuum.

In some implementations, the apparatus is controlled with appropriate hardware and/or appropriate machine-readable instructions in a system controller which may provide control instructions via a sequence of input/output control (IOC) instructions. In one example, the instructions for setting plasma conditions for plasma ignition or maintenance are provided in the form of a plasma activation recipe of a process recipe. In some cases, process recipes may be sequentially arranged, so that all instructions for a process are executed concurrently with that process. In some implementations, instructions for setting one or more plasma parameters may be included in a recipe preceding a plasma process. For example, a first recipe may include instructions for setting a flow rate of an inert (e.g., helium) and/or a reactant gas, instructions for setting a plasma generator to a power set point, and time delay instructions for the first recipe. A second, subsequent recipe may include instructions for enabling the plasma generator and time delay instructions for the second recipe. A third recipe may include instructions for disabling the plasma generator and time delay instructions for the third recipe. It will be appreciated that these recipes may be further subdivided and/or iterated in any suitable way within the scope of the present disclosure.

As described above, two or more process stations may be included in a multi-station substrate processing tool. FIG. 2 depicts an example multi-station substrate processing apparatus. Various efficiencies may be achieved through the use of a multi-station processing apparatus like that shown in FIG. 2 with respect to equipment cost, operational expenses, as well as increased throughput. For instance, a single vacuum pump may be used to create a single high-vacuum environment for all four process stations by evacuating spent process gases, etc. for all four process stations. Depending on the implementation, each process station may have its own dedicated showerhead for gas delivery, but may share the same gas delivery system. Likewise, certain elements of the plasma generator equipment may be shared amongst process stations (e.g., power supplies), although depending on the implementation, certain aspects may be process station-specific (for example, if showerheads are used to apply plasma-generating electrical potentials). Once again, it is to be understood that such efficiencies may also be achieved to a greater or lesser extent by using more or fewer numbers of process stations per processing chamber such as 2, 3, 5, 6, 7, 8, 9, 10, 11, 12, 13, 14, 15, or 16, or more process stations per reaction chamber.

The substrate processing apparatus 200 of FIG. 2 employs a single substrate processing chamber 210 that contains multiple substrate process stations, each of which may be used to perform processing operations on a substrate held in a wafer holder, e.g., a pedestal, at that process station. In this particular implementation, the multi-station substrate processing apparatus 200 is shown having four process stations 231, 232, 233, and 234. Other similar multi-station processing apparatuses may have more or fewer processing stations depending on the implementation and, for instance, the desired level of parallel wafer processing, size/space constraints, cost constraints, etc. Also shown in FIG. 2 are a substrate handler robot 236 and a controller 238.

As shown in FIG. 2, the multi-station processing tool 200 has a substrate loading port 240, and a robot 236 configured to move substrates from a cassette loaded through a pod 242 through atmospheric port 240, into the processing chamber 210, and onto one of the four stations 231, 232, 233, or 234.

The depicted processing chamber 210 shown in FIG. 2 provides four process stations, 231, 232, 233, or 234. The heights, or distances, of the pedestals at each of these stations are individually controllable such that the pedestals can be raised and lowered to a different distance than any of the other pedestals.

The RF power is generated at an RF power system 222 and distributed to each of the stations 231, 232, 233, or 234; similarly a DC power source 226 is distributed to each of the station. The RF power system may include one or more RF power sources, e.g., a high frequency (HFRF) and a low frequency (LFRF) source, impedance matching modules, and filters. In certain implementations, the power source may be limited to only the high frequency or low frequency source. The distribution system of the RF power system may be symmetric about the reactor and may have high impedance. This symmetry and impedance result in approximately equal amounts of power being delivered to each station.

FIG. 2 also depicts an implementation of a substrate transferring device 290 for transferring substrates between process stations 231, 232, 233, and 234 within processing chamber 214. It will be appreciated that any suitable substrate transferring device may be employed. Non-limiting examples include wafer carousels and wafer handling robots.

FIG. 2 also depicts an implementation of a system controller 238 employed to control process conditions and hardware states of process tool 200 and its process stations. System controller 238 may include one or more memory devices 244, one or more mass storage devices 246, and one or more processors 248. Processor 248 may include one or more CPUs, ASICs, general-purpose computer(s) and/or specific purpose computer(s), one or more analog and/or digital input/output connection(s), one or more stepper motor controller board(s), etc.

The system controller 238 may execute machine-readable system control instructions 250 on processor 244 the system control instructions 250, in some implementations, loaded into memory device 244 from mass storage device 246. System control instructions 250 may include instructions for controlling the timing, mixture of gaseous and liquid reactants, chamber and/or station pressure, chamber and/or station temperature, wafer temperature, target power levels, RF power levels, RF exposure time, DC power and duration to clamp a substrate, substrate pedestal, chuck, and/or susceptor position, plasma formation in each station, flow of gaseous and liquid reactants, vertical height of the pedestal, and other parameters of a particular process performed by process tool 200. These processes may include various types of processes including, but not limited to, processes related to deposition of film on substrates. System control instructions 258 may be configured in any suitable way.

In some implementations, system control software 258 may include input/output control (IOC) instructions for controlling the various parameters described above. For example, each step of a deposition process or processes may include one or more instructions for execution by system controller 250. The instructions for setting process conditions for a primary film deposition process, for example, may be included in a corresponding deposition recipe, and likewise for a capping film deposition. In some implementations, the recipes may be sequentially arranged, so that all instructions for a process are executed concurrently with that process.

Other computer-readable instructions and/or programs stored on mass storage device 254 and/or memory device 256 associated with system controller 250 may be employed in some implementations. Examples of programs or sections of programs include a substrate positioning program, a process gas control program, a pressure control program, a heater control program, and a plasma control program.

In some implementations, there may be a user interface associated with system controller 250. The user interface may include a display screen, graphical software displays of the apparatus and/or process conditions, and user input devices such as pointing devices, keyboards, touch screens, microphones, etc.

In some implementations, parameters adjusted by system controller 250 relate to process conditions. Non-limiting examples include process gas compositions and flow rates, temperatures, pressures, plasma conditions (such as RF bias power levels, frequencies, exposure times), etc. Additionally, the controller may be configured to independently control conditions in the process stations, e.g., the controller provides instructions to ignite a plasma in some but not all stations. These parameters may be provided to the user in the form of a recipe, which may be entered utilizing the user interface.

Signals for monitoring the processes may be provided by analog and/or digital input connections of system controller 250 from various process tool sensors. The signals for controlling the processes may be output on the analog and/or digital output connections of process tool 200. Non-limiting examples of process tool sensors that may be monitored include mass flow controllers (MFCs), pressure sensors (such as manometers), thermocouples, load sensors, OES sensors, metrology equipment for measuring physical characteristics of wafers in-situ, etc. Appropriately programmed feedback and control algorithms may be used with data from these sensors to maintain process conditions.

System controller 250 may provide machine-readable instructions for implementing deposition processes. The instructions may control a variety of process parameters, such as DC power level, RF bias power level, station-to-station variations such as RF power parameter variations, frequency tuning parameters, pressure, temperature, etc. The instructions may control the parameters to operate in-situ deposition of film stacks according to various implementations described herein.

The system controller will typically include one or more memory devices and one or more processors configured to execute machine-readable instructions so that the apparatus will perform operations in accordance with the processes disclosed herein. Machine-readable, non-transitory media containing instructions for controlling operations in accordance with the substrate doping processes disclosed herein may be coupled to the system controller.

As mentioned above, processing multiple substrates at multiple process stations within a common substrate processing chamber may increase throughput by enabling film deposition to proceed in parallel on multiple substrates while at the same time utilizing common processing equipment between the various stations. Some multi-station substrate processing tools may be utilized to simultaneously process wafers for an equal number of cycles (e.g., for some ALD processes). Given this configuration of process stations and substrate loading and transferring devices, a variety of process sequences are possible which allow film deposition—say, for instance, N cycles of film deposition for an ALD process or an equal exposure duration for a CVD process—to occur in parallel (e.g., simultaneously) across multiple substrates.

As discussed above, various efficiencies may be achieved through the use of a multi-station tool with respect to equipment cost, operational expenses, as well as increased throughput. However, simultaneously processing multiple substrates in a common chamber can result in station-to-station differences of the deposited material, including, for example, differences in average film thickness, uniformity over the face of wafer, physical properties such as wet etch rate (WER) and dry etch rate (DER), chemical properties, and optical properties. There may be various thresholds of acceptable station-to-station deviations of material properties, but it is desirable to reduce these differences in order to repeatedly produce uniform substrates for commercial scale manufacturing.

Various approaches are used to achieve consistent film deposition across different substrates. Some of these approaches include indexing a substrate through multiple process stations within the processing chamber over the course of a deposition process—i.e., for each substrate, some portion of its film is deposited at one station, and some portion at one or more other processing stations. This may result in an averaging-out of any systematic difference in deposition occurring at the different stations. For example, in an ALD process for which a total of N cycles are to be performed on four wafers in a four-station processing chamber, N/4 cycles may be performed on each wafer in each station, with each wafer being transported to a different station after the completion of each of the N/4 cycles. While this type of "sequential mode" processing or "sequential processing" may be beneficial in some senses, other characteristics of this mode of operation make it less appealing. For example, some implementations of sequential mode involve a great deal of substrate loading/unloading, opening/closing of the processing chamber. In some modes of operation, for a substrate to receive its allotted N depositions over the 4 stations, the processing chamber has to be opened and closed for loading/unloading operations 4 times, each time accompanied by restoration of the environment on chamber's interior back to deposition-appropriate environmental conditions (e.g., temperature, pressure, flow rates, etc.).

"Static mode," when using one station for loading operations, may involve the same amount of indexing—using 90 degree transfer rotations of a cassette on which the wafers are located within the process chamber—to get 4 wafers into position for deposition, but the chamber is only opened and closed once since in static mode no intervening depositions are performed between the transfer rotations. Thus, loading of all four wafers (one by one) into the multi-station chamber prior to deposition is also possible. Even when the chamber remains closed and the internal pressure remains relatively static, the indexing of wafers from one station to the next delays processing.

Because of the time and actions involved with sequential processing and static mode processing, it may be advantageous to utilize another process sequence, referred to herein as "fixed mode" which involves no indexing. In fixed mode, the chamber is opened, wafers are loaded at all of the stations, the chamber is closed, and all of the deposition is performed on all the wafers in parallel and simultaneously while the wafers remain that the same respective station, the deposition cycles conclude, the chamber is opened, and the wafers are removed. Each substrate therefore receives its entire film deposition while positioned at just one of the processing stations. This fixed mode processing may be used for any type of deposition process including, for example, CVD and ALD. Fixed mode processing does not have the delay associated with indexing in other modes, so deposition throughput is higher.

As stated above, this fixed mode may not always achieve consistent film deposition between the different substrates due to process mismatch between the different stations. For example, the process conditions in one station may not exactly match the process conditions in another station, such as different RF frequencies between stations or different temperatures at each station, which may result in a wafer processed at one station having different properties than a wafer processed at another station.

Figure 3:
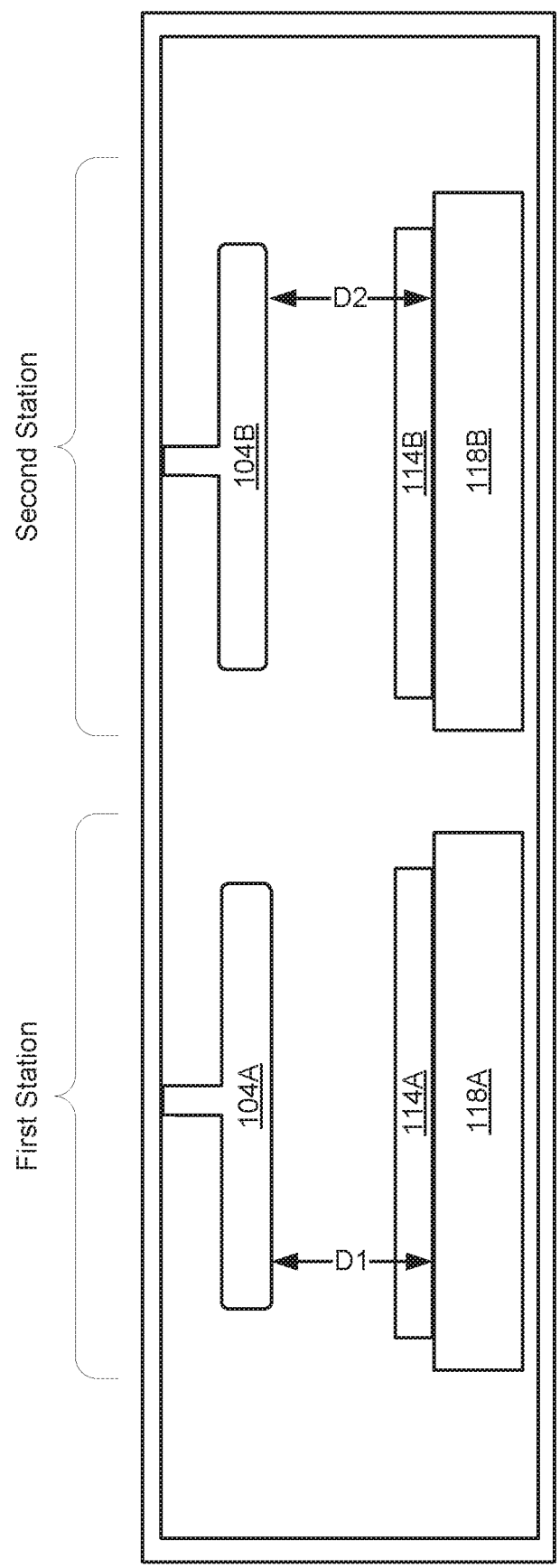
FIG. 3 depicts a cross-sectional schematic of a dual-station processing chamber of a substrate processing tool.

II. Relationship Between Deposited Material Properties and Showerhead-Pedestal Distance As stated above, described herein are techniques and apparatuses for improving station-to-station matching of various deposited material properties by adjusting the gap between the pedestal and the showerhead during plasma generation. In many plasma-assisted deposition processes, such as ALD or PECVD, the showerhead and pedestal are separated by a distance or a gap and a plasma is generated within this gap in order to drive a reaction on the wafer. Unless otherwise stated herein, the terms "gap" or "distance" refer to this spatial relationship between the showerhead and pedestal; additionally, a station gap or distance is synonymous with the pedestal gap or distance. FIG. 3 depicts a cross-sectional schematic of a dual-station processing chamber of a substrate processing tool. Each station of FIG. 3 may include the same features described above in FIGS. 1 and 2, but for illustration purposes, only some features are shown. Here, a first station includes a showerhead 104A and a pedestal 118A that are separated by a first distance D1; similarly a second station includes showerhead 104B and a pedestal 118B that are separated by a first distance D2, which is the same as D1 in this example. This gap or distance may be measured between an external surface of the showerhead, such as a faceplate, and an external surface of the pedestal, like a surface that supports the substrate.

Figure 4:
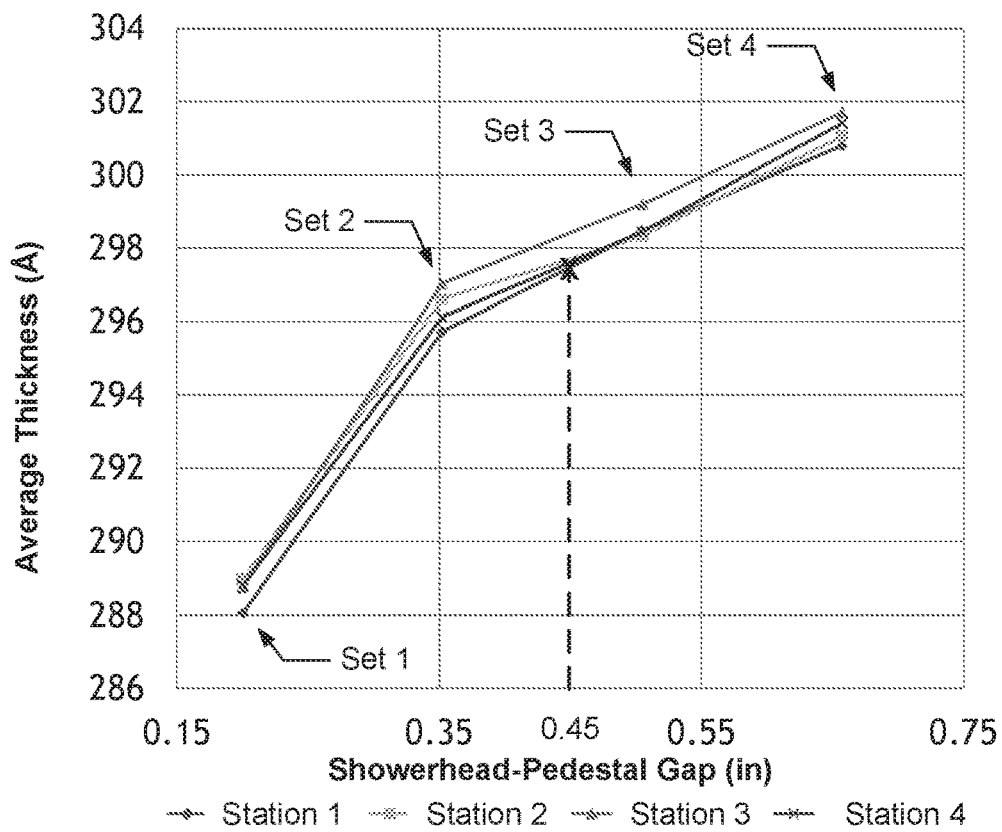
FIG. 4 depicts a plot of material thickness for substrates processed at different distances between a showerhead and a pedestal.

The distance between the showerhead and pedestal during plasma generation has been found to affect various properties of the material deposited on the substrate, such as material thickness, DER, and WER. FIG. 4 depicts a plot of material thickness for substrates processed at different distances between the showerhead and the pedestal. For the data in FIG. 4, four sets of four substrates were processed in a four-station chamber. Each set was positioned at a different distance than the other sets and the remaining process conditions were the same. The measured average thickness of material on the 16 substrates is shown in FIG. 4; the horizontal axis is the distance, in inches, between the pedestal and the showerhead and the vertical axis is the average thickness of deposited material on the substrates. As can be seen, the overall thickness of deposited material decreased as the gap decreased. For instance, set 4 at the largest gap of approximately 0.657 in resulted in deposited material average thicknesses between about 302 Angstroms (Å) and 300 Å, while at a smaller distance of 0.505 in, set 3 resulted in material thicknesses between 298 Å and 300 Å, and at the smallest distance of 0.020 in, set 1 resulted in material thickness between 288 Å and 290 Å.

Figure 5:
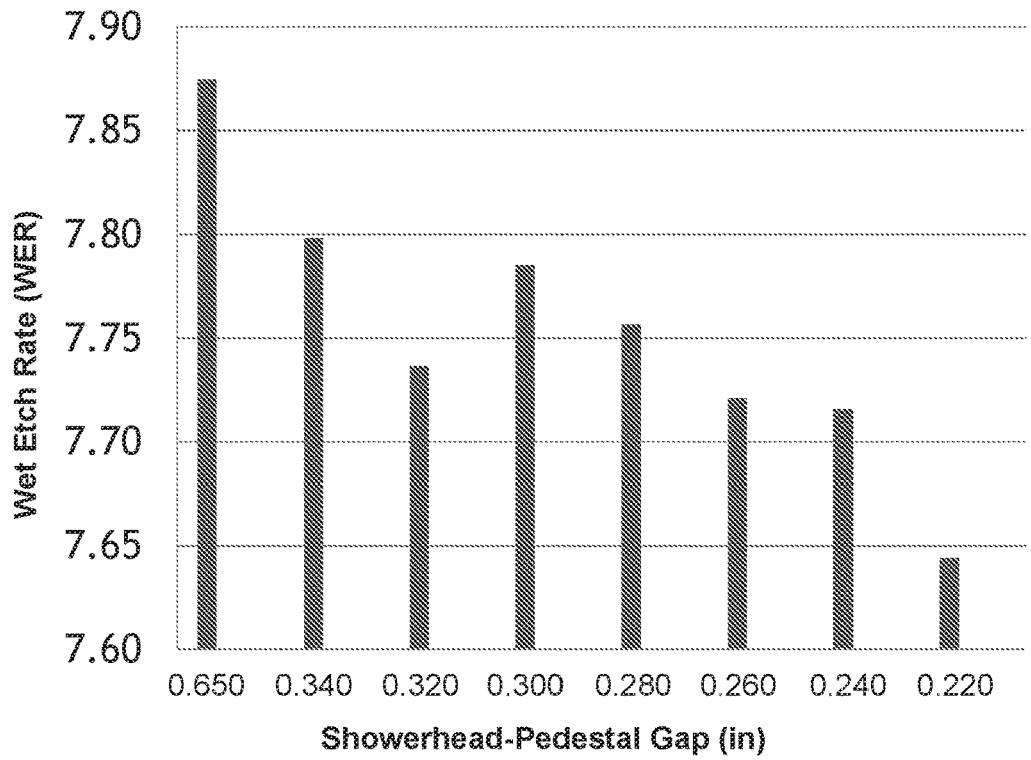
FIG. 5 depicts a plot of wet etch rate (WER) for substrates processed at different distances between the showerhead and the pedestal.

FIG. 5 depicts a plot of wet etch rate (WER) for substrates processed at different distances between the showerhead and the pedestal. Material was deposited on eight substrates under the same conditions, except that the distances were different for all 8 substrates. The measured average WER of the material on each substrate is shown in FIG. 5; the horizontal axis is the distance, in inches, between the pedestal and the showerhead and the vertical axis is the average WER of deposited material on the substrates. As can be seen, the WER changes as the distance changes and similar to the material thicknesses shown in FIG. 4, the WER generally decreases as the distance decreases, but with some non-linear changes. For instance, the WER at a distance of 0.320 in is less than the WER at distances 0.340 in and 0.300 in.

Figure 6:
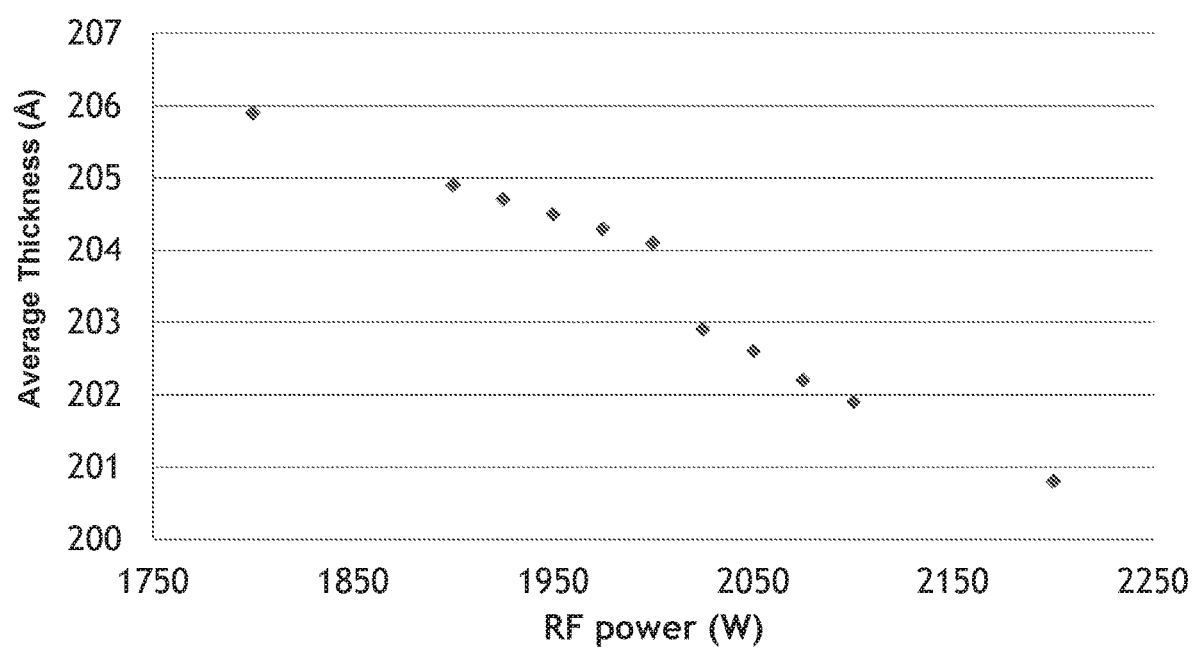
FIG. 6 depicts a plot of material thickness for substrates processed at different power levels.

Changing the distance between the showerhead and the pedestal may also change characteristics of the plasma, such as the plasma power and the plasma sheath. This was found by correlating data of deposited material at different power levels while the distance remained the static with the above FIG. 4 data of material thickness versus pedestal distance. In one experiment, seen in FIG. 6, the power was increased while all other process conditions remained the same, including the distance, which caused the deposited thickness to decrease. FIG. 6 depicts a plot of material thickness for substrates processed at different power levels. Here, material was deposited on eleven substrates and the deposition conditions remained the same, including at the same distance, and the power was changed for each deposition process. The measured average thickness of material on each substrate is shown; the horizontal axis is the plasma power, in Watts (W), and the vertical axis is the average thickness of deposited material on the substrates. As can be seen, the average thickness on the substrate decreased as the plasma power increased. Taken together with the data of FIG. 4 which indicates that decreasing the gap decreases the deposited thickness, FIGS. 6 and 4 suggest an inverse relationship between the distance and plasma power such that decreasing the gap increases the power delivered to the substrate on the pedestal. Based on this relationship, adjusting the gap can adjust the power delivered to the substrate.

III. Example Techniques

Because of the relationships between the distance and resulting material properties and plasma characteristics, the techniques and apparatuses herein utilize pedestals at different distances to adjust properties of deposited materials and reduce station-to-station variations. In some embodiments, differences of a material property between stations can be reduced by changing the showerhead-pedestal gap in order to adjust the material property at that one station; this may be considered tuning the material property at that station. The distance may also be adjusted during the deposition process to produce film properties having different values throughout the material. For example, the distance may be adjusted during the deposition to cause one section the material to have one value of a property and another section of the material, such as different values of densities, WERs, or DERs, within the material. Positioning pedestals at different distances with respect to each other during the deposition may be implemented in various ways.

Accordingly, in some embodiments, the pedestal distances may be different with respect to each other throughout deposition, including changing distances during deposition. This may include the pedestals (i) starting at different distances than each other and remaining at those different distances for the entirety of the deposition, (ii) starting at the same starting at the same distances as each other and then changing to different distances later in the deposition process, (iii) starting at different distances and then changing to the same distance later in the deposition process, (iv) starting at different distances and then changing to other different distances later in the deposition process, and (v) being at different distances within each deposition cycle. In some other embodiments, the pedestals may remain at the same distance relative to each other throughout deposition, but change distances with respect to the showerhead throughout deposition.

A. Example Techniques with Pedestals at Different Distances

Figure 7:
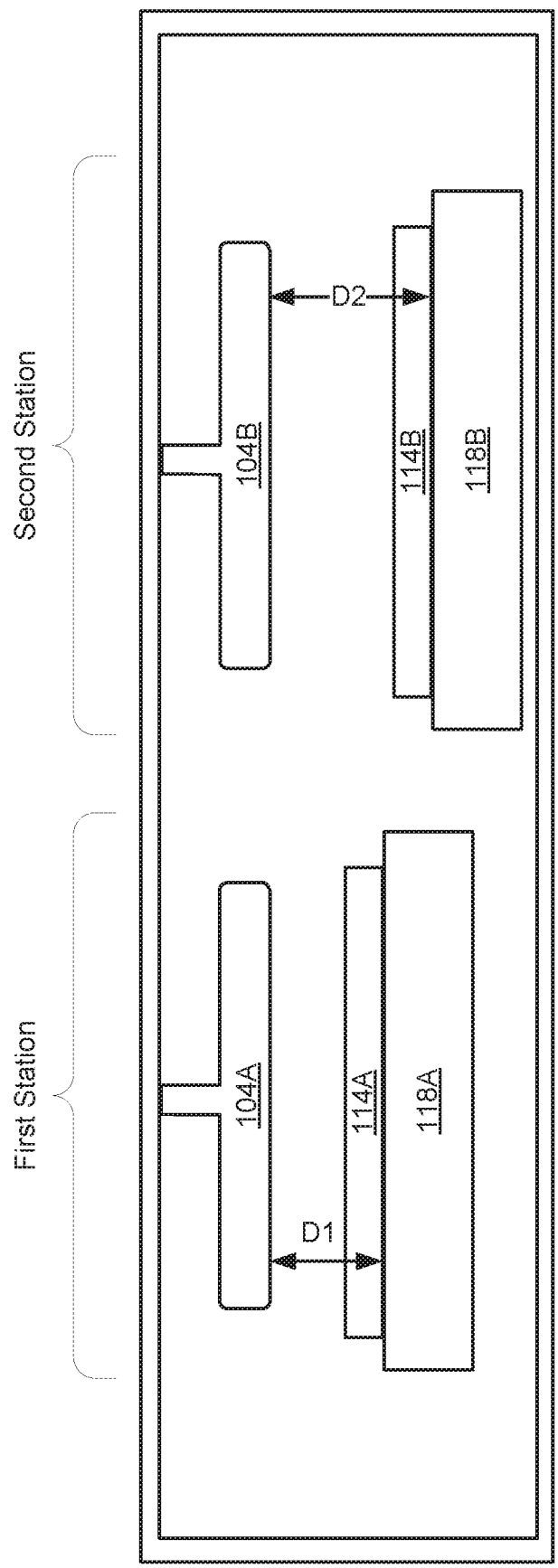
FIG. 7 depicts a cross-sectional schematic of a dual-station processing chamber of a substrate processing tool according to various embodiments.
Figure 8:
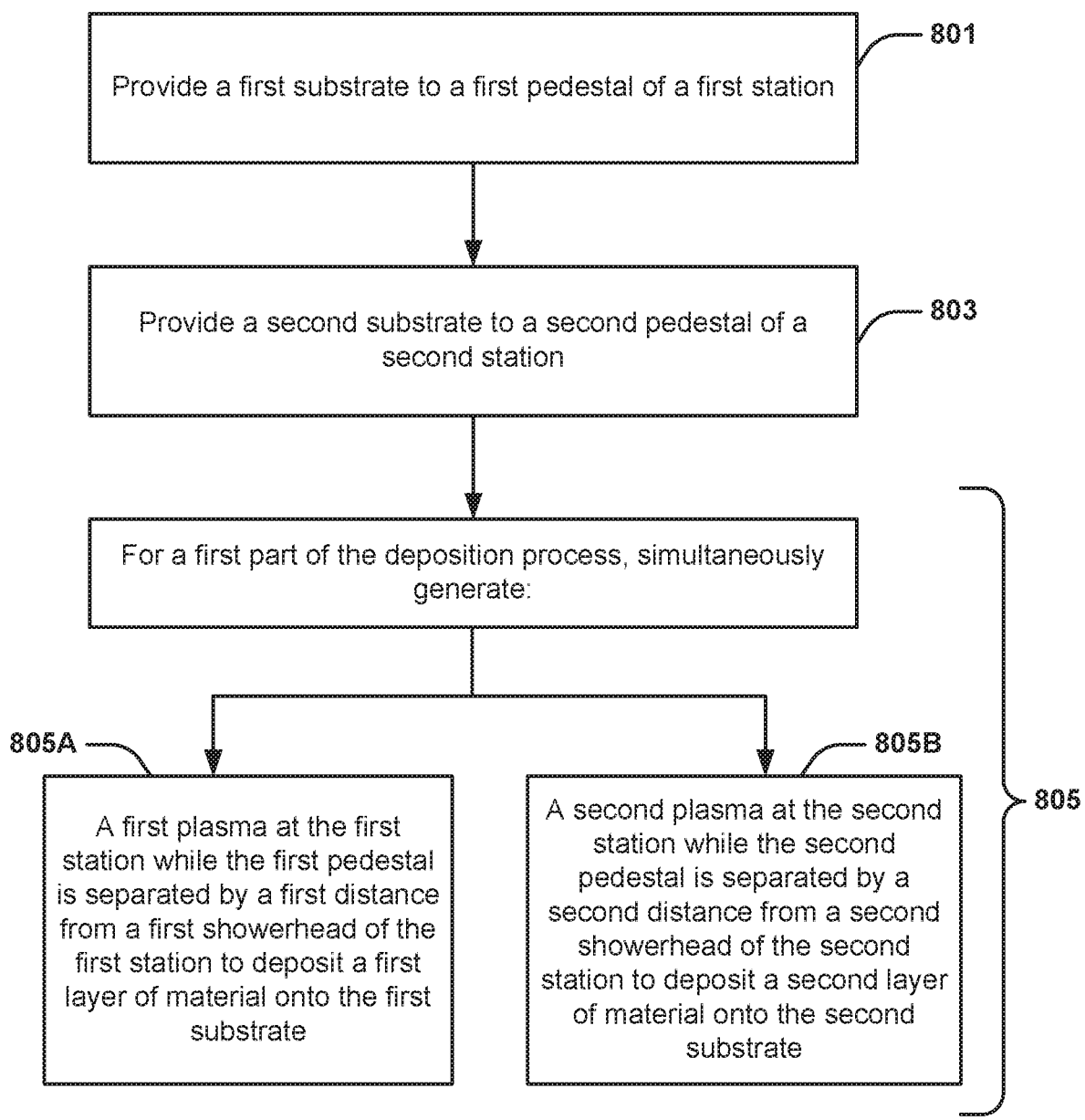
FIG. 8 depicts a first example technique for performing film deposition in a multi-station semiconductor processing chamber.

In a first example technique, the distances may be adjusted, or tuned, before deposition such that two or more pedestals are at different distances than each other before deposition and remain at those different distances for the entire deposition process. FIG. 7 depicts a cross-sectional schematic of a dual-station processing chamber of a substrate processing tool according to various embodiments. Here, the same chamber of FIG. 3 is depicted, but the first and second pedestals are shown at different distances than each other, with the first distance D1 smaller than the second distance D2. FIG. 8 depicts a first example technique for performing film deposition in a multi-station semiconductor processing chamber; the chamber of FIG. 7 will be used to describe this technique. In block 801, the first substrate 114A is positioned onto the first pedestal 118A of the first station, and in block 803, the second substrate 114B is positioned onto the second pedestal 118B of the second station. Although not depicted in FIG. 8, the distances of each pedestal may be adjusted before or after the substrate is positioned onto the pedestal. Additionally, in some embodiments, blocks 801 and 803 may be performed in the reverse order or simultaneously.

Once these pedestals are at their different respective distances, plasmas may be simultaneously generated at the first and second stations in order to simultaneously deposit material on both the first and second substrates, 114A and 114B. This simultaneous plasma generation and deposition is represented by block 805 which includes blocks 805A and B. In block 805A, a first plasma is generated at the first station while, in block 805B, a second plasma is simultaneously generated at the second station. As further indicated in blocks 805A and 805B, this simultaneous plasma generation deposits a first layer of material onto the first substrate 114A and a second layer of material onto the second substrate 114B. As used herein, a "layer" of material may be the total layer of material that is deposited after a complete deposition process which may include multiple sub-layers of material, and it may also include a single, discrete layer or sub-layer of material, such as a single discrete layer of material deposited by ALD. In some embodiments, these first and second layers may have the substantially same characteristics as each other, such as WER, DER, and thickness (substantially the same means within, e.g., 10%, 5%, 1%, 0.5%, or 0.1% of each other). This may result in better station to station matching such that stations at different distances produce an overall material thickness that is the same.

For instance, if the thickness between two stations does not match within a certain threshold from each other, then the distance at one of the stations may be adjusted to change the deposited thickness at the adjusted station so the thicknesses are closer together. Referring to FIG. 4, for example, at the distance of 0.35 in, station 3 has an average thickness of about 297 Å while station 1 has an average thickness slightly less than 296 Å. This variation may be reduced by increasing the distance of station 1 to about 0.45 (marked by the dashed line and X in FIG. 4) so that its deposited thickness is about 297 Å, which is nearly identical to the thickness of station 3. Accordingly, in this example the simultaneous plasma generation and deposition of blocks 805A and 805B may be simultaneously performed while station 3 is at a distance of 0.35 in and while station 1 is at a distance of 0.45 in in order to produce deposited material having the substantially same thickness.

In some embodiments, these first and second layers may have different characteristics than each other, such as different densities or thicknesses. This may still result in better matching for other material characteristics. For instance, the material properties may have different densities than each other, but still result in the same thickness (which may be due to other process conditions, such as deposition rate).

In some embodiments, the pedestals may be at different distances for only a part of a deposition process in order to change the characteristics of only a part of the deposited material. Depositing first and second layers with different characteristics may be advantageous for fine tuning the characteristics of just that one part of the deposited material.

Figure 9:
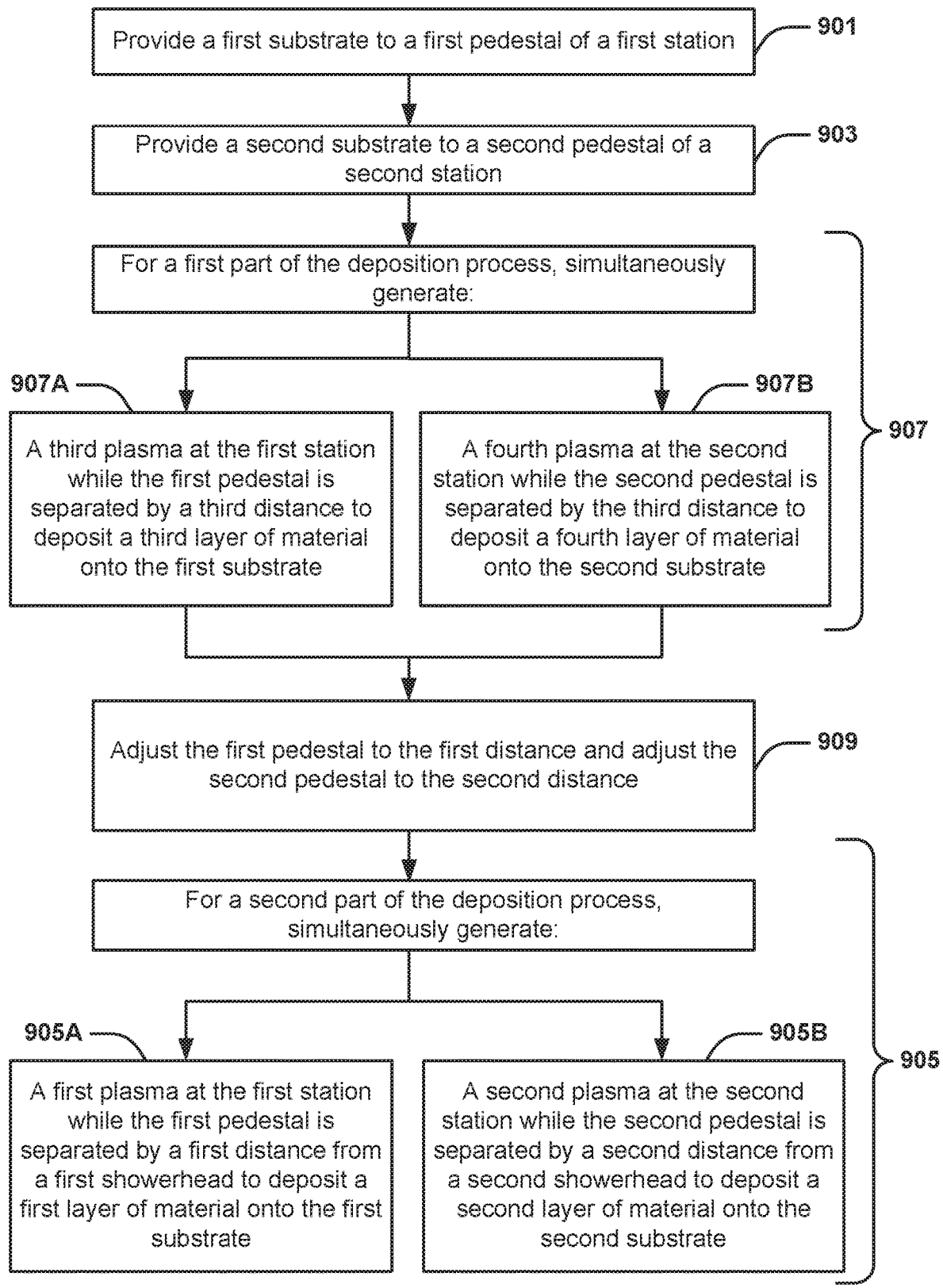
FIG. 9 depicts a second example technique for performing film deposition in a multi-station semiconductor processing chamber.

In a second example technique, illustrated in FIG. 9, in some implementations the pedestals may start at the same distances as each other and then change to different distances later in the deposition process. FIG. 9 depicts a second example technique for performing film deposition in a multi-station semiconductor processing chamber. Blocks 901-905 are the same as blocks 801-805 of FIG. 8, but as illustrated in FIG. 9, before the simultaneous plasma generation and deposition of block 905, in block 907 material is simultaneously deposited on the two substrates while the pedestals are positioned at the same distance. As can be seen, in block 907A the first pedestal is at the third distance and in block 907B the second pedestal is at the same third distance. After the simultaneous plasma generation and deposition of block 907 is performed, the first pedestal is adjusted to the first distance and the second pedestal is adjusted to the second distance in block 909. Following this adjustment, the simultaneous plasma generation and deposition of block 905 is performed during which the first and second pedestals are at different distances.

Figure 10C:
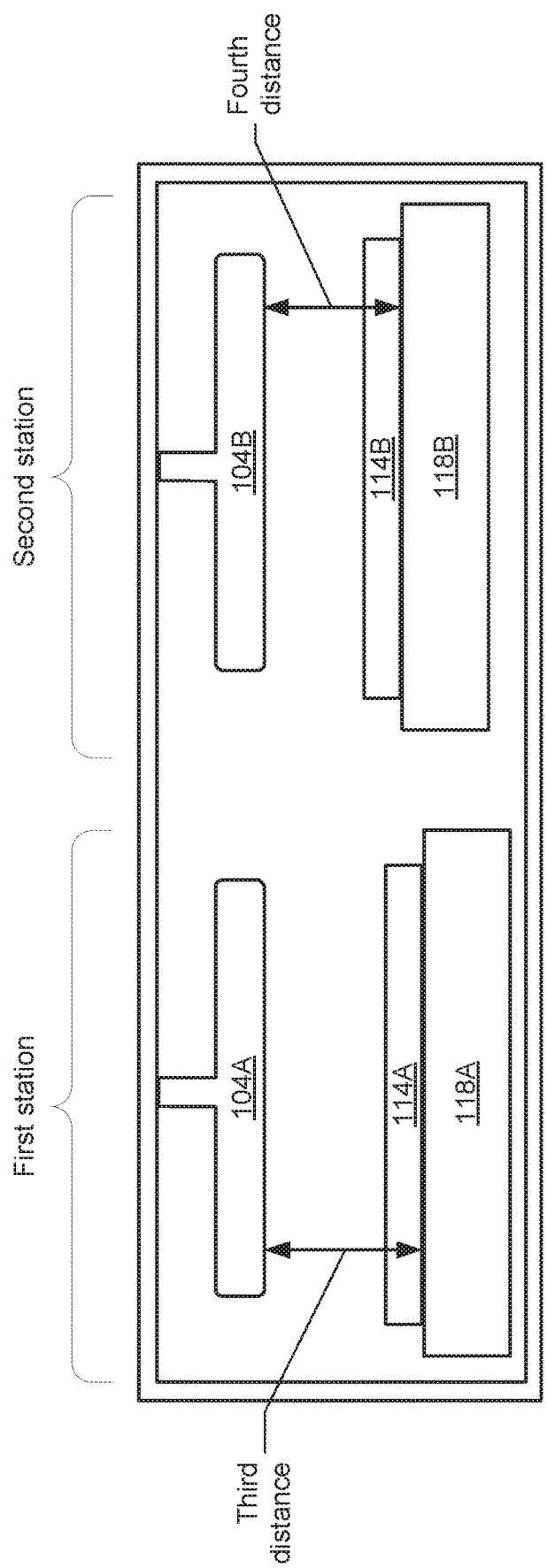

The second technique is further illustrated in FIGS. 10A-10E which depict example sequences of pedestal movement in an example multi-station processing chamber. The chamber of FIGS. 10A-10E are similar to the chambers of FIGS. 3 and 7 with noted differences with regard to the distances. Like noted above, the pedestals in the chambers of FIGS. 10A-10E are movable pedestals that are configured to be moved and positioned at various distances. In FIG. 10A, the first and second stations are both at the third distance which corresponds to block 907 of FIG. 9. After the deposition of block 907, block 909 is performed to move the pedestals as seen in FIG. 10B. Here in FIG. 10B, the first station is at the first distance and the second station is at the second distance. Once at this positioning in FIG. 10B, the simultaneous plasma generation and deposition of block 905 of the second example technique may be performed. In this example technique, the first, second, and third distances are all different from each other.

In some other embodiments, the pedestals may be at different distances for a first part of the overall deposition process and later in a second part of the deposition process, the pedestals may be changed to the same distance. In this third example technique, blocks 905 and 907 are switched and block 909 is revised. Here, blocks 901, 903, and 905 are sequentially performed such that the first simultaneous plasma generation and deposition is performed on the first and second substrates is while the first and second pedestals are at different distances. After performing block 905, a revised block 909 is performed in which the distance of the pedestals is adjusted such that they are at the same third distance; the simultaneous plasma generation and deposition of block 907 is then performed. Referring back to the illustrations of FIGS. 10A and 10B, the third example technique may initially be positioned as depicted in FIG. 10B and then later be positioned as in FIG. 10A.

In some other embodiments, simultaneous plasma generation and deposition may initially occur on the substrates while they are at the same distance and then after this, only one of the pedestal distances may be adjusted. In a fourth example technique, referring to FIG. 9, blocks 901, 903, and 907 may be sequentially performed, but block 909 is different in that only the first pedestal distance is adjusted to the first distance while the second pedestal remains at the third distance. In this example, the first and third distances are different than each other, and the second distance is the same as the third distance. Following this adjustment, the simultaneous plasma generation and deposition of block 905 is performed while the first pedestal is at a different distance from the second pedestal, but the second pedestal is at the same distance as in in block 907.

In some such embodiments, a first section of material may be simultaneously deposited on two substrates under one set of process conditions and a property of the first sections on each substrate may not match. The distance of one station may be adjusted, simultaneous deposition of a second section of material may be performed on the two substrates, and the different distance of the one station may change the second section of the material such that the property of the first sections may be closer in value. For example, an overall target thickness of deposited material may be 280 Å on both substrates and after the first deposition, the thicknesses of the first section of material may be different from each other, e.g., 275 A and 272 Å. The adjustment of one station to a different distance may change the thickness of the deposited material at that station so that the second sections have different thicknesses, but the overall thicknesses of the first and second sections together are closer to each other. In this example, the second section of material at the adjusted station may be 8 Å and at the other it may be 5 Å, thereby resulting in matching 280 Å material thicknesses on both substrates after the second deposition.

Similarly, a fifth example technique may include initially performing simultaneous plasma generation and deposition on the substrates while the pedestals are at different distances, followed by adjusting only one of the pedestals so that it is at the same distance as the other pedestal for subsequent simultaneous plasma generation and deposition. Referring to FIG. 9, this may include, in sequential order, performing blocks 901, 903, 905, an adjusting block different than 909 in which the first pedestal is adjusted from the first distance to the second distance so that both pedestals are at the same distance, i.e. the second distance, and then block 907.

Figure 11:
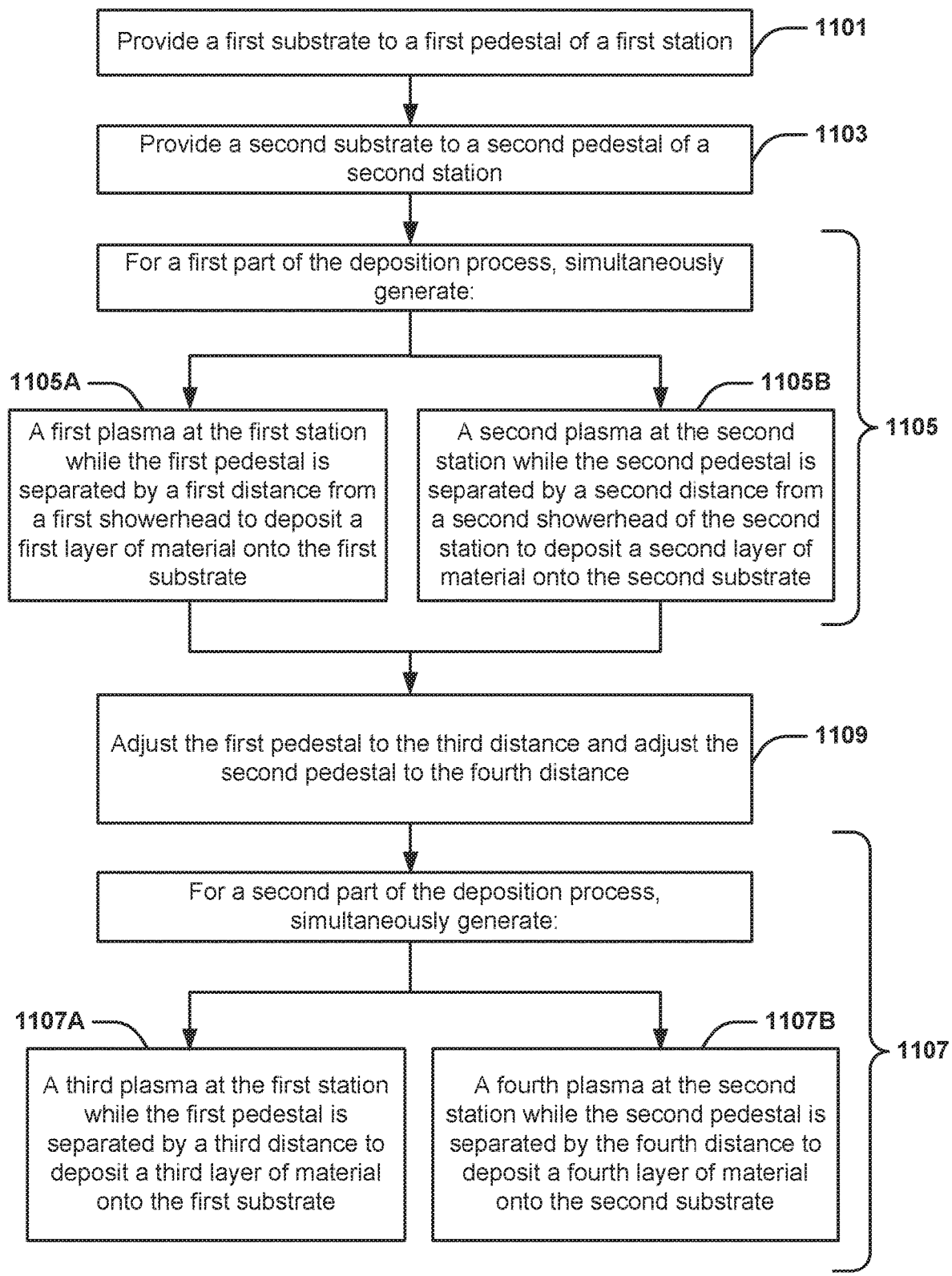
FIG. 11 depicts a sixth technique for performing film deposition in a multi-station semiconductor processing chamber.

In a sixth example technique, the substrates may be positioned at different distances for one part of the deposition process and then at other, different distances for another part of the deposition processes. FIG. 11 depicts a sixth technique for performing film deposition in a multi-station semiconductor processing chamber. Here, blocks 1101 through 1105 are the same as blocks 801 through 805 and blocks 901, 903, and 905 described above with respect to FIGS. 8 and 9. Here in FIG. 11, blocks 1101, 1103, 1105 are performed, and then the adjustment block 1109 adjusts the first pedestal to the third distance, which is different than the first distance, and adjusts the second pedestal to the fourth distance, which is different than the second distance. After the pedestals are at these other, different distances, another simultaneous deposition is performed on the two substrates in block 1107.

Referring to FIGS. 10B and 10C, block 1105 corresponds to the chamber of FIG. 10B while block 1107 corresponds to the chamber of FIG. 10C in which the first station is at the third distance and the second station is at the fourth distance. Although the first distance is smaller than the third distance, in some embodiments this may opposite such that the first distance is larger than the third distance. This may be the same with the second and fourth distances.

In some embodiments, the amount each station is adjusted may differ with respect to each station. In some other embodiments, it may be desirable to maintain the pedestals at different distances from each other, but to adjust them by the same amount. This may provide for uniform control and adjustment of properties to all of the substrates. For instance, the difference between the first and third distances may be the same as the second and fourth distances.

B. Example Techniques with Pedestals at the Same Distance

Figure 12:
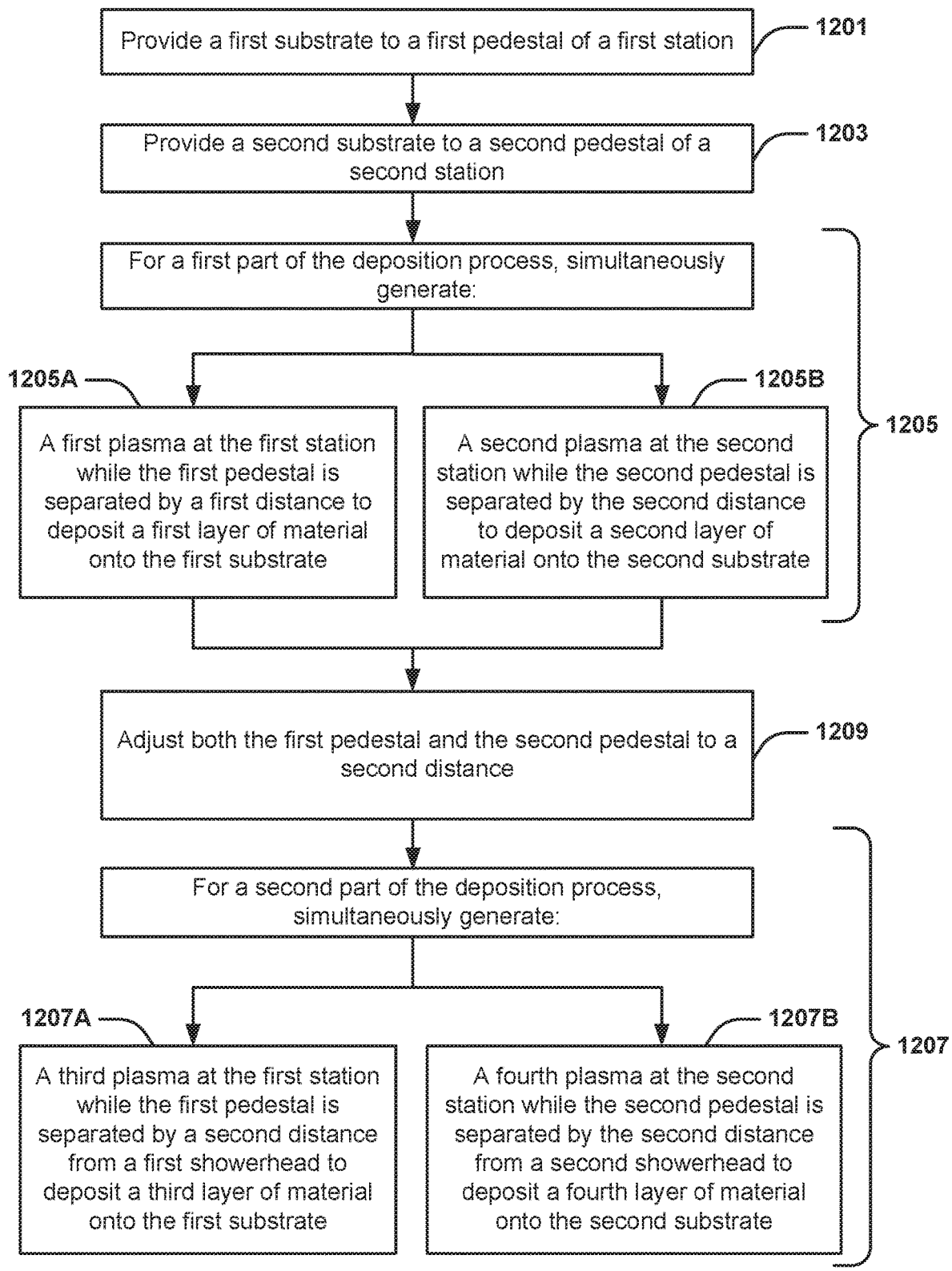
FIG. 12 depicts a seventh example technique for performing film deposition in a multi-station semiconductor processing chamber.

As stated above, the pedestals in some embodiments may remain at the same distance with respect to each other, but are positioned at different distances during the deposition process with respect to the showerhead. This concept is illustrated with FIG. 12 which depicts a seventh example technique for performing film deposition in a multi-station semiconductor processing chamber. Here, blocks 1201 and 1203 are the same as blocks 801 and 803 described above. In block 1205, the first and second pedestals are both positioned at the same first distance from their respective showerheads; first and second plasmas are simultaneously generated in the stations to deposit first and second layers of material onto the first and second substrates, respectively. In block 1209, the first and second pedestals are both adjusted to the same second distance, after which, in block 1207, third and fourth plasmas are simultaneously generated in the stations to deposit third and fourth layers of material onto the first and second substrates, respectively. Referring back to FIGS. 10D and 10E, these Figures correspond to the seventh example technique. FIG. 10D corresponds to block 1205 in which the first pedestal 118A and the second pedestal 118B are both at the same first distance. FIG. 10E corresponds to block 1207 in which the first pedestal 118A and the second pedestal 118B are both at the same second distance.

Here, the pedestals remain at the same distance during the deposition process with respect to each other, but are at different distances with respect to the showerheads. These embodiments may create a deposited material with different values of a property throughout the material. For instance, the deposited material on the first substrate has two different properties within the material, such as two different densities or WERs. The distances may be adjusted additional times in order to create additional values and gradients within the deposited material.

In some embodiments, like depicted in FIGS. 10D and 10E, the first distance may be larger than the second distance. Performing some deposition while the pedestals are initially farther away from the showerhead may be advantageous for some deposition processes. As described above and seen in FIGS. 4 and 6, decreasing plasma power is associated with increasing the pedestal-showerhead distance; this seventh example technique may be used to initially expose a substrate to a lower power plasma in order to protect the substrate. Once several layers of material are deposited onto the substrate, the plasma power may be increased by decreasing the distance. For example, some deposition of silicon oxide onto a carbon substrate may cause some carbon consumption or damage during processing. However, at the beginning of the deposition when some carbon is exposed, this consumption and damage can be reduced by exposing the substrate to a lower power plasma by positioning the pedestal at a larger distance. Once some deposition has occurred and the carbon is protected and no longer exposed, the plasma power can be increased by decreasing the distance.

C. Use of Example Techniques with Various Deposition Processes

As stated above, all of the example techniques may be used in various deposition processes, such as CVD and ALD. For example, referring to FIG. 8, the simultaneous plasma generation and deposition of block 805 may be the entire CVD deposition process for the first and second substrates.

Figure 13:
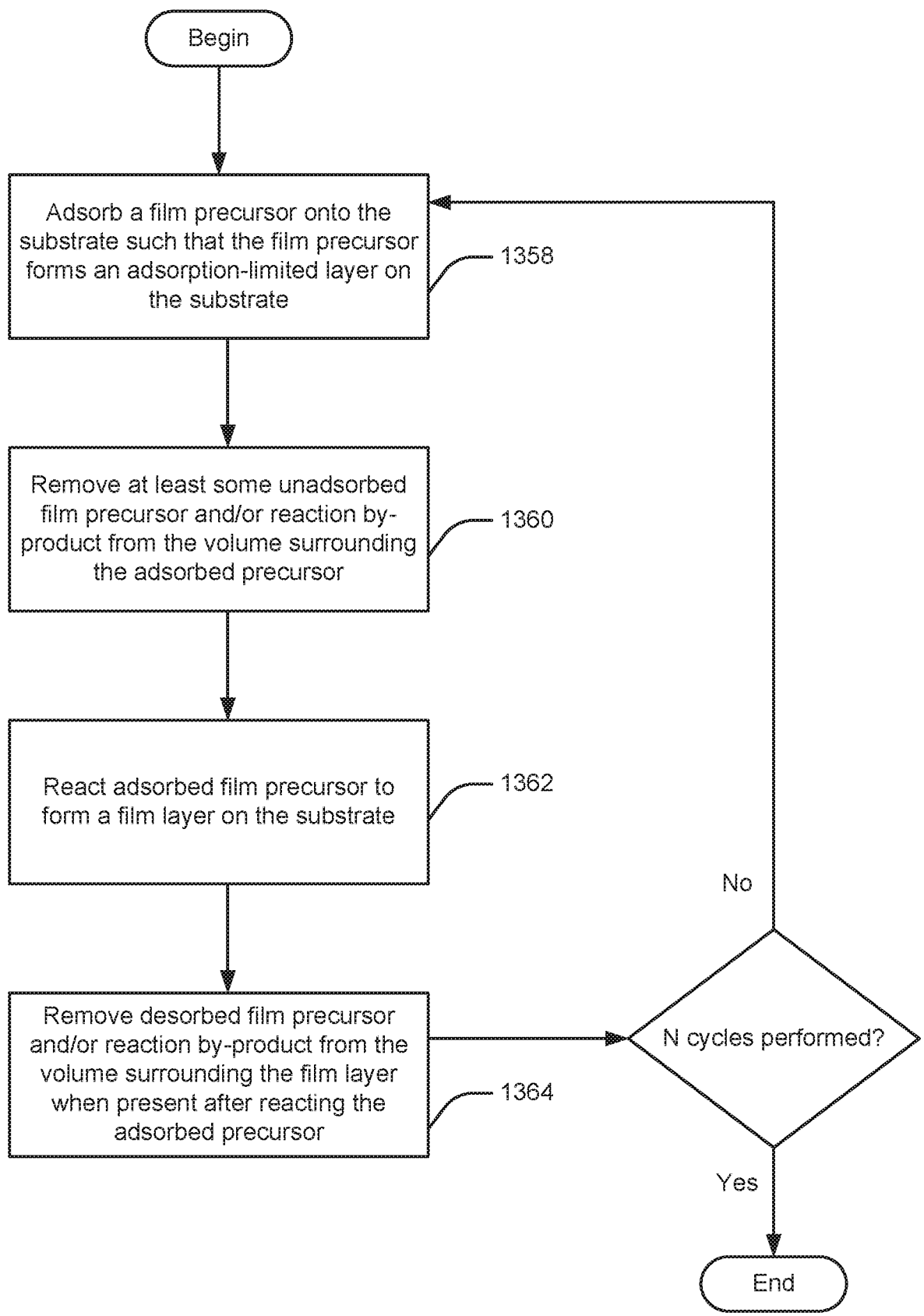
FIG. 13 depicts a flowchart of an example sequence of operations for forming a film of material on a substrate via an ALD process.

For cyclic deposition processes like ALD, the simultaneous plasma generation and deposition of blocks 805, 905 and 907, and 1105 and 1107 described above may be performed for each cycle of deposition such these blocks are repeated over a deposition process. As stated above, a typical ALD cycle includes (1) exposure of the substrate surface to a first precursor, (2) purge of the reaction chamber in which the substrate is located, activation of a reaction of the substrate surface, typically with a plasma and/or a second precursor, and (4) purge of the reaction chamber in which the substrate is located. FIG. 13 depicts a flowchart of an example sequence of operations for forming a film of material on a substrate via an ALD process. As can be seen in FIG. 13, item 1 above corresponds with block 1358, item 2 above corresponds with block 1360, item 3 above corresponds with block 1362, and item 4 above corresponds with block 1364; the four blocks are performed for N cycles, after which the process is stopped.

The simultaneous plasma generation and deposition of the example techniques described herein, e.g., blocks 805, 905 and 907, and 1105 and 1107, may be considered the activation step, step 3 1362, of the basic ALD cycle. As stated above, this activation step is performed in each deposition cycle and each cycle includes igniting and then extinguishing the plasma. For example, with the first example technique of FIG. 8, if the entire deposition process includes N cycles, then the simultaneous plasma generation and deposition block 805 may be performed in each of the N cycles.

In the techniques with multiple simultaneous plasma generation and deposition blocks, such as the example technique of FIG. 9, the overall deposition process may be split into two or more parts, with each part having a particular number of deposition cycles, and for the cycles of each part, only one of the simultaneous plasma generation and deposition blocks is performed. For instance, one part may have X cycles, another part may have Y cycles, and one of the simultaneous plasma generation and deposition blocks is performed in each of the X cycles while the another simultaneous plasma generation and deposition block is performed in each of the Y cycles. For instance, referring to FIG. 9, block 907 may be performed in each of the X cycles and block 905 may be performed in each of the Y cycles; this results in block 907 being performed X times and block 907 being performed Y times.

Figure 14:
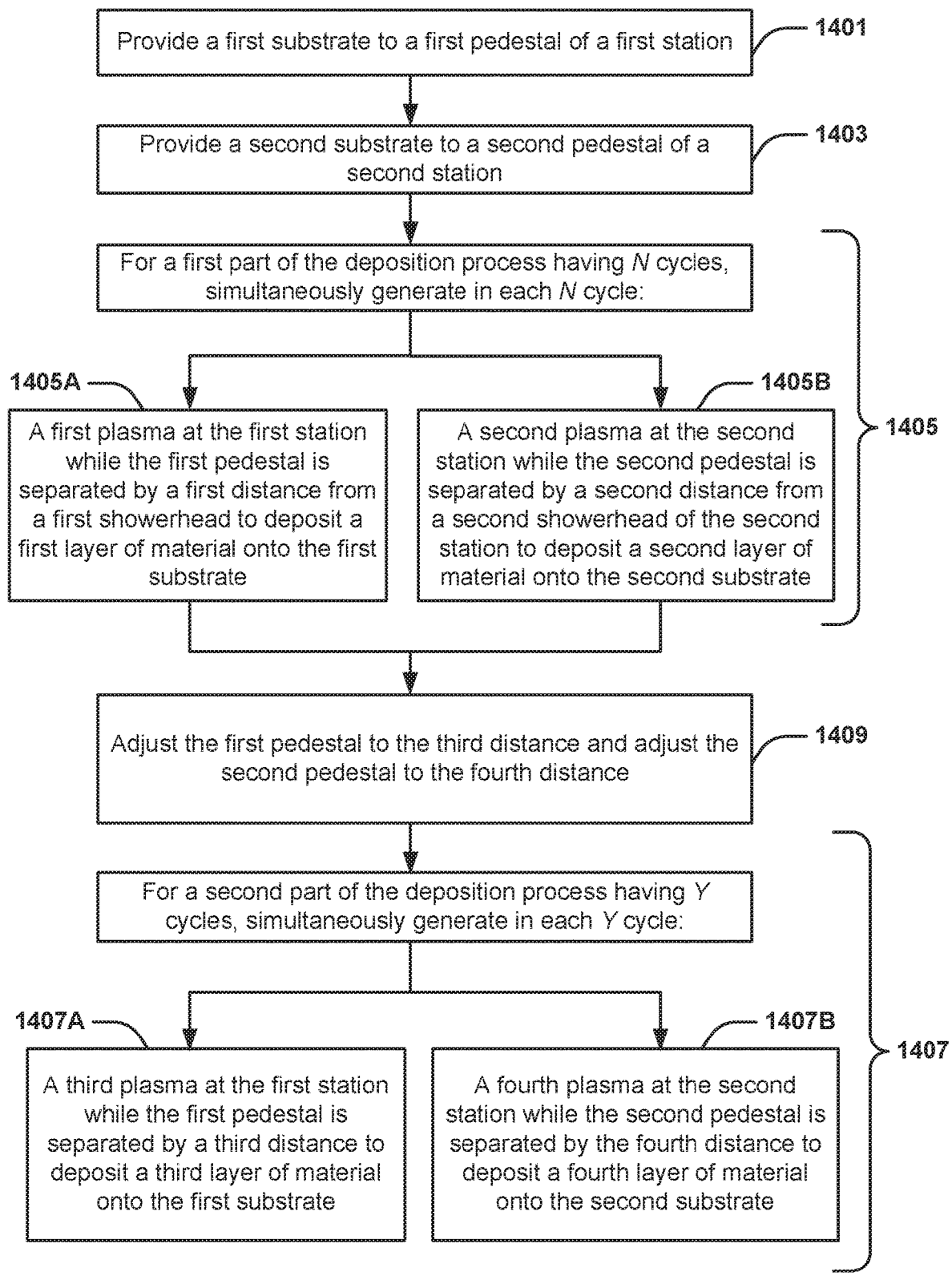
FIG. 14 depicts another example technique which is an illustration of the same sixth example technique of FIG. 11.

All of the other example techniques may be similarly performed such that each simultaneous plasma generation and deposition block is performed for a particular number of deposition cycles in one part of the overall deposition process. For another example, in the sixth example technique of FIG. 11, the overall deposition process may have two parts, with the first part having N cycles and the second part having Z cycles. FIG. 14 depicts another example technique which is an illustration of the same sixth example technique of FIG. 11. Here, block 1405, which corresponds to block 1105, is performed in each of the N cycles of the first part such that block 1105 is performed N times, and then block 1107 is performed in each of the Z cycles of the second part such that block 907 is performed Z times.

In some other cyclic embodiments, the pedestals may be at different positions throughout each deposition cycle. For example, referring back to FIG. 8, a deposition process may again have N deposition cycles. In each of these N deposition cycles, block 805 may be performed. Additionally, the pedestals may be at different distances in other parts of the deposition cycle. For instance, the first and second pedestals may both be positioned at a third distance during the adsorption step of each cycle, and then adjusted to the first and second distances for each activation step. In some other embodiments, the first and second pedestals may both be positioned at the same distance for the activation step, i.e., simultaneous plasma generation and material deposition, and then both positioned at the same, but different distance for another step or steps of each cycle, such as the adsorption step.

For all of the example techniques described herein, depending on the other processing conditions, the deposited first and second layers or material simultaneously deposited on the substrate may be the same or may be different. For instance, they may have the same thickness or they may have a different density. Similarly, in FIGS. 8, 9, and 11, one or more characteristics of the plasmas generated at each station may be different from each other. For instance, referring to FIG. 8, the first and second plasma generated at the different distances may have different plasma powers than each other. However, in some instances, depending on the overall process conditions, the first and second plasma generated at the different distances may have the same plasma power as each other.

In some embodiments, the techniques described herein are used in the static mode, such that the substrates remain at the same station for all of the deposition process. In some other embodiments, the techniques may be used on other processing modes, such as sequential processing. For example, two or more substrates may be loaded into the chamber and only half of the overall deposition is performed on these substrates. Afterwards, the first two or more substrates are transferred to other stations and two or more new substrates are loaded into the chamber, and another half of the deposition process is simultaneously performed on the first two or more substrates and the two or more new substrates. This completes the deposition on the first two or more substrates and completes the first half of deposition on the second two or more substrates. Afterwards, the first two or more substrates are unloaded from the chamber, the second two or more substrates are transferred to other stations, and a third set of two or more substrates is loaded. This process may repeat. During this sequential deposition, the stations may be at different distances, like described herein. This may be considered a 2×4 technique.

During the example techniques described herein, unless otherwise stated, the substrates remain in a fixed position on the respective pedestals until they are unloaded; the substrates are not moved with respect to the pedestals except during the loading and unloading onto the pedestals.

D. Additional Techniques for Calibration

In some embodiments, calibration deposition processes may be performed in order to determine and associate showerhead-pedestals distances with different material property values. The calibration deposition processes may include positioning a first set of substrates at the stations, positioning the pedestals at a first distance, simultaneously generating plasmas at the stations to deposition material onto the first set of substrates, and then determining, such as by measuring, the resulting value of a material property, such as thickness, WER, DER, and density. Next, a second set of substrates may be loaded onto the pedestals, the pedestals may be set to a second distance, the deposition process may be repeated on the second set of substrates, and the resulting value of the material property may again be determined. This deposition and determination may be repeated for N sets of substrates at N different distances. The determined values of the material property for each station are associated with the distance at which the deposition occurred for that station and this information can be used in any of the above techniques in order to adjust a pedestal distance and deposit a known value of a material property.

For example, referring back to FIG. 4, this may be considered data from calibration deposition processes. Here, deposition was performed on four sets of substrates while each set was at a different distance, and the resulting average material thickness was measured after each deposition. Accordingly, this determined data can later be used to adjust each pedestal distance in order to produce a known thickness at that station. Like described above, the pedestal of station 1 can be adjusted to a distance of 0.45 inches in order to match the thickness of station 3 that is at a distance of 0.35 inches. Similarly, FIG. 5 may provide calibration data for WER values at different distances which can be used in later processing to adjust the WER value at a particular station. The adjustments to processing after calibration data is gathered can be used to reduce station-to-station nonuniformity.

In another example, the multi-station processing chamber may undergo servicing or maintenance, after which a first set of substrates is loaded into the chamber, deposition is performed, and properties of the material are measured, such as thickness. If there is nonuniformity between the substrates, the distance of one or more pedestals can be adjusted to reduce this nonuniformity. In FIG. 4, if the measured thickness of station 3 is at 299 Å, but the other three stations are at about 296 Å, the distance of station 3 may be adjusted to 0.35 inches in order to produce a deposition thickness of about 296 Å as correlated by the calibration data of FIG. 4.

IV. Additional Apparatus

Figure 15A:
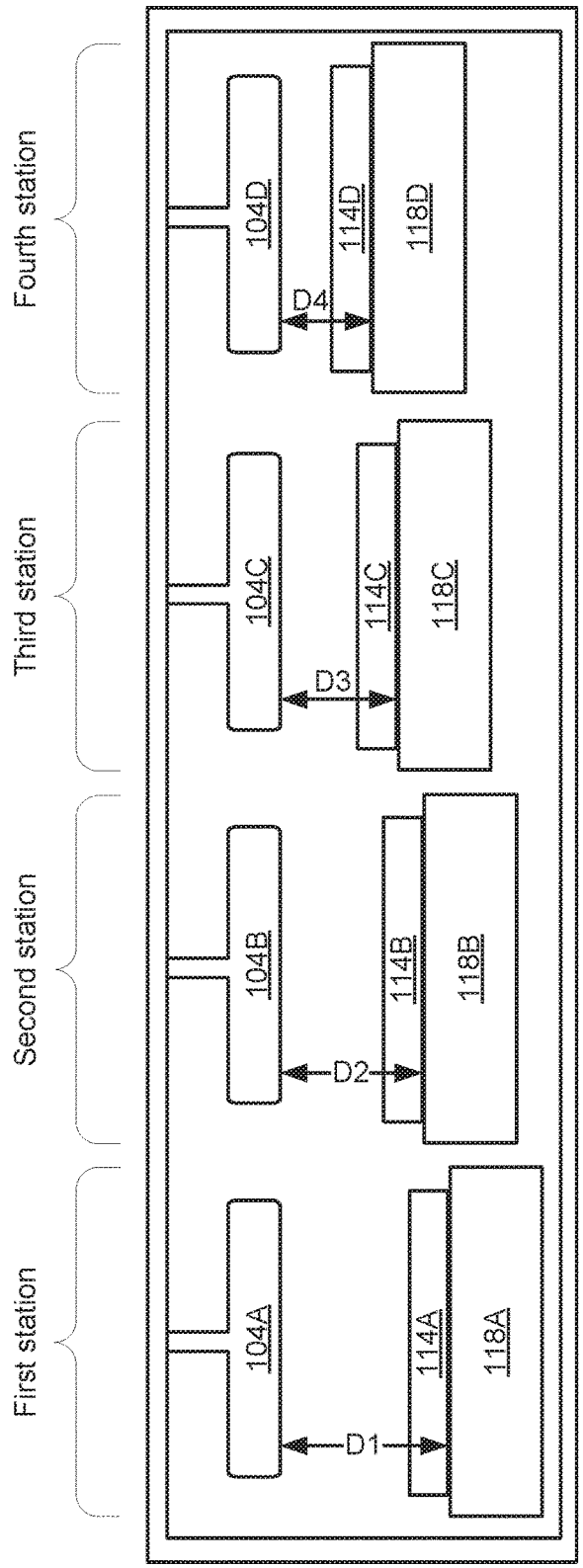
FIGS. 15A and 15B depict example sequences of pedestal movement in a second example multi-station processing chamber having four processing stations.
Figure 15B:
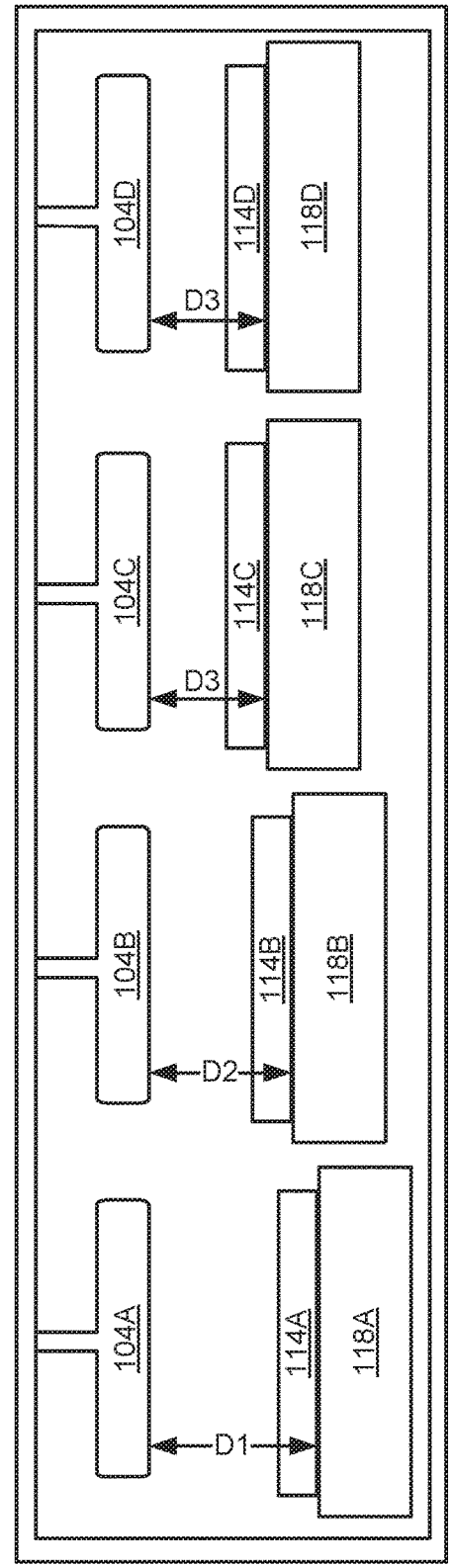

The techniques and apparatuses described herein are not limited to a multi-station chamber having only two stations and are applicable to any number of stations, such as three, four, six, eight, 10, etc. stations. In some such embodiments, at least some deposition may occur when two or more of the pedestals are at different distances from each other; this may also include some pedestals being positioned at the same distance. FIGS. 15A and 15B depict example sequences of pedestal movement in a second example multi-station processing chamber having four processing stations. Each of these four stations are the same as in FIGS. 7 and 10A-10E such that each station has a showerhead, a pedestal, and a substrate on the pedestal. In FIG. 15A, the pedestals in all four stations are at different distances from each other, with the first station at a first distance D1, the second station at a second distance D2, the third station at a third distance D3, and the fourth station at a fourth distance D4. Simultaneous plasma generation and deposition in the four stations while the stations are all at different distances may be performed for all or some of an overall deposition process on the four substrates, 114A-D. In some embodiments, two or more pedestals may be at different distances while two or more pedestals may be at the same distance. In FIG. 15B, the first, second, and third stations are all at different distances while the third station and the fourth station are at the same distance, D3. Again, simultaneous plasma generation and deposition in the four stations while the stations are at these distances may be performed for all or some of an overall deposition process on the four substrates, 114A-D.

Adjustments to the distances described above may also be performed on a multi-station processing chamber having more than two stations. For example, similar to the second example technique of FIG. 9, the more than two stations may all be at the same distance for a first part of overall deposition process, including for N deposition cycles, after which the distances are adjusted so two or more stations are at different distances than each other for another part of the deposition process, such as for X deposition cycles. Additionally, the order of these parts of the deposition process may be switched such that more than two stations are at different distances for the beginning of the deposition and then changed to the same distance later in the deposition process. Furthermore, like the sixth technique, the two or more pedestals may be a different distances than each other for one part of the overall deposition process and then adjusted to other different distances in a second part of the overall deposition process. For instance, referring to FIG. 15A, the four stations may be at the four different distances D1-D4 for the first part of the deposition process and then all adjusted to distances D5-D8, respectively, for a second part of the deposition process.

In some embodiments, a semiconductor processing tool or apparatus may have a controller with program instructions for executing any and all of the example techniques described herein. For instance, the apparatus may have the features of the substrate processing apparatus 200 of FIG. 2, including the processing chamber 210 with multiple processing stations (e.g., stations 231-234). Additionally, each pedestal in the apparatus is configured be positioned at various distances, such as adjusted before, during, and after operation.

The controller 238 may have program instructions to control the apparatus to deposit material onto the substrates at the stations, including executing the techniques described above. This may include providing a first substrate to the first pedestal at station 231, providing a second substrate to the second pedestal at station 232, moving the first pedestal so that it is separated by a first distance from the first showerhead, moving the second pedestal so that it is separated by a second distance from the second showerhead, and simultaneously generating a first plasma at the first station while the first pedestal is separated by the first distance from the first showerhead, thereby depositing a first layer of material onto the first substrate, and a second plasma at the second station while simultaneously generating the first plasma and while the second pedestal is separated by the second distance from the second showerhead, thereby depositing a second layer of material onto the second substrate. The controller may also include additional instructions to adjust the distances of each pedestal, including moving the first pedestal to a third distance, moving the second pedestal to a fourth distance, and then simultaneously generating a third plasma at the first station while the first pedestal is separated by the third distance from the first showerhead, thereby depositing a third layer of material onto the first substrate, and a fourth plasma at the second station while simultaneously generating the third plasma and while the second pedestal is separated by the fourth distance from the second showerhead, thereby depositing a fourth layer of material onto the second substrate.

Although the above disclosure has focused on adjusting the pedestal position to control deposition parameters, the same control may be used to control etch characteristics in an etch process. Some semiconductor fabrication processes involve patterning and etching of various materials, including conductors, semiconductors, and dielectrics. Some examples include conductors, such as metals or carbon; semiconductors, such as silicon or germanium; and dielectrics, such as silicon oxide, aluminum dioxide, zirconium dioxide, hafnium dioxide, silicon nitride, and titanium nitride. Atomic layer etching ("ALE") processes remove thin layers of material using sequential self-limiting reactions. Generally, an ALE cycle is the minimum set of operations used to perform an etch process one time, such as etching a monolayer. The result of one ALE cycle is that at least some of a film layer on a substrate surface is etched. Typically, an ALE cycle includes a modification operation to form a reactive layer, followed by a removal operation to remove or etch only this reactive layer. The cycle may include certain ancillary operations such as removing one of the reactants or byproducts. Generally, a cycle contains one instance of a unique sequence of operations.

As an example, a conventional ALE cycle may include the following operations: (i) delivery of a reactant gas, (ii) purging of the reactant gas from the chamber, (iii) delivery of a removal gas and an optional plasma, and (iv) purging of the chamber. In some embodiments, etching may be performed nonconformally. The modification operation generally forms a thin, reactive surface layer with a thickness less than the un-modified material. In an example modification operation, a substrate may be chlorinated by introducing chlorine into the chamber. Chlorine is used as an example etchant species or etching gas, but it will be understood that a different etching gas may be introduced into the chamber. The etching gas may be selected depending on the type and chemistry of the substrate to be etched. A plasma may be ignited and chlorine reacts with the substrate for the etching process; the chlorine may react with the substrate or may be adsorbed onto the surface of the substrate. The species generated from a chlorine plasma can be generated directly by forming a plasma in the process chamber housing the substrate or they can be generated remotely in a process chamber that does not house the substrate, and can be supplied into the process chamber housing the substrate.

Accordingly, any of the above techniques and apparatuses may be used for etching. In some embodiments, instead of depositing a layer of material in each station, the techniques may remove a portion of material in each station. This may provide greater wafer-to-wafer uniformity in either etch or deposition processes. For example, in FIG. 8, operation 805 may be an etching phase in which for a first part of the etching process, the first and second plasmas are simultaneously generated while the first and second pedestals are separated by the first and second distances, respectively, in order to remove first and second portions of material from the first and second substrates, respectively.

Although the above description has focused on controlling pedestal distances for plasma-based operations, any and all of the above techniques may be applied to other aspects or phases of semiconductor processing, such as while substrates are being exposed to a precursor. This may include, for instance, during a dose phase of an ALD cycle or during concurrent plasma and precursor exposure of PECVD. For example, while the techniques described above and shown in FIGS. 8-12, 14, and 15A-B concern plasma generation, the disclosed techniques naturally extend to exposure to processes in which a precursor contacts a substrate. In some embodiments, for a first part of a deposition process, the techniques may include simultaneously flowing a precursor onto the first substrate at the first station while the first pedestal is separated by a first distance from a first showerhead of the first station, and onto the second substrate at the second station while the second pedestal is separated by the second distance from a second showerhead of the second station, with the first distance different than the second distance.

In some other embodiments, deposition process steps that include simultaneous plasma generation and exposure to a precursor may include, for a first part of a deposition process, simultaneously (i) generating a first plasma at the first station and concurrently flowing a precursor onto the first substrate while the first pedestal is separated by a first distance from a first showerhead of the first station, thereby depositing a first layer of material onto the first substrate, and (ii) generating a second plasma at the second station and concurrently flowing the precursor onto the second substrate while the second pedestal is separated by the second distance from a second showerhead of the second station, thereby depositing a second layer of material onto the second substrate, with the first distance different than the second distance.

In addition to the claims listed in this disclosure, the following additional implementations are to be understood to be within the scope of this disclosure:

Implementation 1: A multi-station deposition apparatus, the apparatus comprising: a processing chamber; a first process station in the processing chamber that includes a first showerhead and a first pedestal configured to be moved vertically with respect to the first showerhead; a second process station in the processing chamber that includes a second showerhead and a second pedestal configured to be moved vertically with respect to the second showerhead; and a controller for controlling the multi-station deposition apparatus to deposit a material onto substrates at the first and second stations, the controller comprising control logic for: providing a first substrate to the first pedestal, providing a second substrate to the second pedestal, moving the first pedestal so that it is separated by a first distance from the first showerhead, moving the second pedestal so that it is separated by a second distance from the second showerhead, and simultaneously generating: a first plasma at the first station while the first pedestal is separated by the first distance from the first showerhead, thereby depositing a first layer of material onto the first substrate, and a second plasma at the second station while the second pedestal is separated by the second distance from the second showerhead, thereby depositing a second layer of material onto the second substrate, in which the first distance is different than the second distance.

Implementation 2: The apparatus of implementation 1, in which the controller further comprises control logic for: moving the first pedestal so that it is separated by a third distance from the first showerhead, moving the second pedestal so that it is separated by fourth distance from the second showerhead, and simultaneously generating: a third plasma at the first station while the first pedestal is separated by the third distance from the first showerhead, thereby depositing a third layer of material onto the first substrate, and a fourth plasma at the second station while the second pedestal is separated by the fourth distance from the second showerhead, thereby depositing a fourth layer of material onto the second substrate.

Implementation 3: The apparatus of implementation 2, in which the third distance is different than the fourth distance Implementation 4: The apparatus of implementation 2, in which the third distance is same as the fourth distance.

Implementation 5: The apparatus of implementation 4, in which the controller further comprises control logic for simultaneously generating the third plasma at the third station and the fourth plasma at the fourth station before simultaneously generating the first plasma at the first station and the second plasma at the second station.

Implementation 6: The apparatus of implementation 4, in which the controller further comprises control logic for simultaneously generating the third plasma at the third station and the fourth plasma at the fourth station after simultaneously generating the first plasma at the first station and the second plasma at the second station.

Implementation 7: The apparatus of implementation 1, the first pedestal is configured to apply a first chucking force on the first substrate, the second pedestal is configured to apply a second chucking force on the second substrate, and the controller further includes control logic for causing, during the first part of the deposition process, the first pedestal to apply the first chucking force on the first substrate and the second pedestal to apply the second chucking force on the second substrate.

Implementation 8: The apparatus of implementation 7, in which the first and second chucking forces are electrostatic forces.

Implementation 9: The apparatus of implementation 7, in which the first and second chucking forces are exerted by a vacuum.

Implementation 10: A multi-station deposition apparatus, the apparatus comprising: a processing chamber; a first process station in the processing chamber that includes a first showerhead and a first pedestal configured to be moved vertically with respect to the first showerhead; a second process station in the processing chamber that includes a second showerhead and a second pedestal configured to be moved vertically with respect to the second showerhead; and a controller for controlling the multi-station deposition apparatus to deposit a material onto substrates at the first and second stations, the controller comprising control logic for: providing a first substrate to the first pedestal, providing a second substrate to the second pedestal, moving the first pedestal so that it is separated by a first distance from the first showerhead, moving the second pedestal so that it is separated by the first distance from the second showerhead, simultaneously generating: a first plasma at the first station while the first pedestal is separated by the first distance from the first showerhead, thereby depositing a first layer of material onto the first substrate, and a second plasma at the second station while the second pedestal is separated by the first distance from the second showerhead, thereby depositing a second layer of material onto the second substrate, moving, after simultaneously generating the first plasma and the second plasma, the first pedestal so that it is separated by a second distance from the first showerhead, moving, after simultaneously generating the first plasma and the second plasma, the second pedestal so that it is separated by the second distance from the first showerhead, and simultaneously generating: a third plasma at the first station while the first pedestal is separated by the second distance from the first showerhead, thereby depositing a third layer of material onto the first substrate, and a fourth plasma at the second station while the second pedestal is separated by the second distance from the second showerhead, thereby depositing a fourth layer of material onto the second substrate.

Implementation 11: The apparatus of implementation 10, in which the first distance is larger than the second distance.

Implementation 12: A multi-station deposition apparatus, the apparatus comprising: a processing chamber; a first process station in the processing chamber that includes a first showerhead and a first pedestal configured to be moved vertically with respect to the first showerhead; and a second process station in the processing chamber that includes a second showerhead and a second pedestal configured to be moved vertically with respect to the second showerhead, in which the first pedestal is separated from the first showerhead by a first distance, and the second pedestal is separated from the second showerhead by a second distance different than the first distance.

Implementation 13: The apparatus of implementation 12, further comprising a third process station in the processing chamber that includes a third showerhead and a third pedestal configured to be moved vertically with respect to the third showerhead, in which the third pedestal is separated from the third showerhead by a third distance that is same as the first distance.

Implementation 14: The apparatus of implementation 13, further comprising a fourth process station in the processing chamber that includes a fourth showerhead and a fourth pedestal configured to be moved vertically with respect to the fourth showerhead, in which the fourth pedestal is separated from the fourth showerhead by a fourth distance that is different than the first distance, the second distance, and the third distance.

Implementation 15: The apparatus of implementation 13, further comprising a fourth process station in the processing chamber that includes a fourth showerhead and a fourth pedestal configured to be moved vertically with respect to the fourth showerhead, in which the fourth pedestal is separated from the fourth showerhead by a fourth distance that is the same as the first distance or the second distance.

Implementation 16: The apparatus of implementation 12, further comprising a third process station in the processing chamber that includes a third showerhead and a third pedestal configured to be moved vertically with respect to the third showerhead, in which the third pedestal is separated from the third showerhead by a third distance that is different than the first distance and the second distance.

Implementation 17: The apparatus of implementation 16, further comprising a fourth process station in the processing chamber that includes a fourth showerhead and a fourth pedestal configured to be moved vertically with respect to the fourth showerhead, in which the fourth pedestal is separated from the fourth showerhead by a fourth distance that is different than the first distance, the second distance, and the third distance.

Implementation 18: The apparatus of implementation 16, further comprising a fourth process station in the processing chamber that includes a fourth showerhead and a fourth pedestal configured to be moved vertically with respect to the fourth showerhead, in which the fourth pedestal is separated from the fourth showerhead by a fourth distance that is the same as the first distance, the second distance, or the third distance.

Implementation 19: A method of depositing material onto substrates in a multi-station deposition apparatus having a first station and a second station, the method comprising: providing a first substrate onto a first pedestal of the first station; providing a second substrate onto a second pedestal of the second station; and for a first part of a deposition process, simultaneously flowing a precursor: onto the first substrate at the first station while the first pedestal is separated by a first distance from a first showerhead of the first station, and onto the second substrate at the second station while the second pedestal is separated by a second distance from a second showerhead of the second station, in which the first distance is different than the second distance.

Implementation 20: The method of implementation 19, further comprising simultaneously flowing, for a second part of the deposition process, the precursor: onto the first substrate at the first station while the first pedestal is separated by a third distance from the first showerhead, and onto the second substrate at the second station while the second pedestal is separated by a fourth distance from the second showerhead, in which the second distance is different than the fourth distance.

Implementation 21: The method of implementation 19, in which the first part includes N deposition cycles, and each of the N deposition cycles includes simultaneously flowing the precursor onto the first substrate at the first station while the first pedestal is separated by the first distance and onto the second substrate at the second station while the second pedestal is separated by the second distance.

Implementation 22: The method of implementation 21, further comprising: for a second part of the deposition process that includes P deposition cycles, simultaneously flowing the precursor in each of the P deposition cycles: onto the first substrate at the first station while the first pedestal is separated by a third distance from the first showerhead, and onto the second substrate at the second station while the second pedestal is separated by a fourth distance from the second showerhead.

Implementation 23: The method of implementation 21, further comprising: for a second part of the deposition process, after the first part, that includes X deposition cycles, simultaneously flowing the precursor in each of the X deposition cycles: onto the first substrate at the first station while the first pedestal is separated by a third distance from the first showerhead, and onto the second substrate at the second station while the second pedestal is separated by the third distance from the second showerhead.

Implementation 24: The method of implementation 21, further comprising: for a second part of the deposition process, before the first part, that includes Y deposition cycles, simultaneously flowing the precursor in each of the Y deposition cycles: onto the first substrate at the first station while the first pedestal is separated by a third distance from the first showerhead, and onto the second substrate at the second station while the second pedestal is separated by the third distance from the second showerhead.

Implementation 25: A method of depositing material onto substrates in a multi-station deposition apparatus having a first station and a second station, the method comprising: providing a first substrate onto a first pedestal of the first station; providing a second substrate onto a second pedestal of the second station; for a first part of a deposition process, simultaneously flowing a precursor: onto the first substrate at the first station while the first pedestal is separated by a first distance from a first showerhead of the first station, and onto the second substrate at the second station while the second pedestal is separated by the first distance from a second showerhead of the second station; adjusting, after the first part, the first pedestal to a second distance and the second pedestal to the second distance; and for a second part of the deposition process, simultaneously flowing the precursor: onto the first substrate at the first station while the first pedestal is separated by the second distance, and onto the second substrate at the second station while the second pedestal is separated by the second distance.

Implementation 26: A method of depositing material onto substrates in a multi-station deposition apparatus having a first station and a second station, the method comprising: providing a first substrate onto a first pedestal of the first station; providing a second substrate onto a second pedestal of the second station; and for a first part of a deposition process, simultaneously: generating a first plasma at the first station and concurrently flowing a precursor onto the first substrate while the first pedestal is separated by a first distance from a first showerhead of the first station, thereby depositing a first layer of material onto the first substrate, and generating a second plasma at the second station and concurrently flowing the precursor onto the second substrate while the second pedestal is separated by a second distance from a second showerhead of the second station, thereby depositing a second layer of material onto the second substrate, in which the first distance is different than the second distance.

In the following description, numerous specific details are set forth in order to provide a thorough understanding of the presented concepts. The presented concepts may be practiced without some or all of these specific details. In other instances, well known process operations have not been described in detail so as to not unnecessarily obscure the described concepts. While some concepts will be described in conjunction with the specific embodiments, it will be understood that these embodiments are not intended to be limiting.

Unless the context of this disclosure clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also generally include the plural or singular number respectively. Additionally, the words "herein," "hereunder," "above," "below," and words of similar import refer to this application as a whole and not to any particular layers of this application. When the word "or" is used in reference to a list of two or more items, that word covers all of the following interpretations of the word: any of the items in the list, all of the items in the list, and any combination of the items in the list. The term "implementation" refers to implementations of techniques and methods described herein, as well as to physical objects that embody the structures and/or incorporate the techniques and/or methods described herein. The term "substantially" herein, unless otherwise specified, means within 5% of the referenced value. For example, substantially perpendicular means within +/−5% of parallel.

What is claimed is:

1. A method of depositing material onto substrates in a multi-station deposition apparatus having a first station and a second station, the method comprising:
providing a first substrate onto a first pedestal of the first station;
providing a second substrate onto a second pedestal of the second station; and
for a first part of a deposition process, simultaneously generating:
a first plasma at the first station while the first pedestal is separated by a first distance from a first showerhead of the first station, thereby depositing a first layer of material onto the first substrate, and
a second plasma at the second station while the second pedestal is separated by a second distance from a second showerhead of the second station, thereby depositing a second layer of material onto the second substrate;
wherein, subsequent to the first part of the deposition process, a value of a property associated with the first layer of material on the first substrate and a value of the property associated with the second layer of material on the second substrate are different by a first amount, the property comprising a thickness of the material; and
for a second part of the deposition process initiated based on nonuniformity between at least a thickness associated with the first layer of material and a thickness associated with the second layer of material from the first part of the deposition process, subsequent to adjusting, based on calibration data correlating the thickness of the material measured with respect to distances between a showerhead and a pedestal, at least one of the first distance or the second distance, simultaneously generating:
a third plasma at the first station, thereby depositing a third layer of material onto the first substrate; and
a fourth plasma at the second station, thereby depositing a fourth layer of material onto the second substrate;
wherein the adjusting of the at least one of the first distance or the second distance for the second part of the deposition process based on the calibration data comprises:
(i) selecting a distance for the first distance such that the thickness associated with the third layer of material on the first substrate matches the thickness associated with the second layer of material on the second substrate; or
(ii) selecting a distance for the second distance such that the thickness associated with the fourth layer of material on the second substrate matches the thickness associated with the first layer of material on the first substrate; or
(iii) a combination of (i) and (ii);
wherein, subsequent to the second part of the deposition process, the value of the property associated with material on the first substrate and the value of the property associated with material on the second substrate are different by a second amount that is less than the first amount such that the nonuniformity from the first part of the deposition process is reduced.

2. The method of claim 1, wherein during the second part of the deposition process:
the third plasma is generated at the first station while the first pedestal is separated by a third distance from the first showerhead, wherein the first distance is different than the third distance; and
the fourth plasma is generated at the second station while the second pedestal is separated by a fourth distance from the second showerhead, wherein the second distance is different than the fourth distance.

3. The method of claim 2, wherein the difference between the first distance and the third distance is substantially the same as the difference between the second distance and the fourth distance.

4. The method of claim 1, further comprising simultaneously generating for a second layer of the deposition process:
the third plasma at the first station while the first pedestal is separated by a third distance from the first showerhead; and
the fourth plasma at the second station while the second pedestal is separated by the third distance from the second showerhead.

5. The method of claim 1, wherein:
the first part includes N deposition cycles, and
each of the N deposition cycles includes:
simultaneously generating the first plasma at the first station while the first pedestal is separated by the first distance thereby depositing the first layer of material onto the first substrate, and the second plasma at the second station while the second pedestal is separated by the second distance thereby depositing the second layer of material onto the second substrate, and
igniting and extinguishing the first plasma and the second plasma.

6. The method of claim 5, further comprising:
for the second part of the deposition process, after the first part, that includes X deposition cycles, simultaneously generating in each of the X deposition cycles:
the third plasma at the first station while the first pedestal is separated by a third distance from the first showerhead, thereby depositing the third layer of material onto the first substrate, and
the fourth plasma at the second station while the second pedestal is separated by the third distance from the second showerhead, thereby depositing the fourth layer of material onto the second substrate, wherein each of the X deposition cycles includes igniting and extinguishing the third plasma and the fourth plasma.

7. The method of claim 5, further comprising:
for the second part of the deposition process, before the first part, that includes Y deposition cycles, simultaneously generating in each of the Y deposition cycles:
the third plasma at the first station while the first pedestal is separated by a third distance from the first showerhead, thereby depositing the third layer of material onto the first substrate, and the fourth plasma at the second station while the second pedestal is separated by the third distance from the second showerhead, thereby depositing the fourth layer of material onto the second substrate, wherein each of the Y deposition cycles includes igniting and extinguishing the third plasma and the fourth plasma.

8. The method of claim 5, further comprising:
adjusting the first pedestal between the first distance and a third distance;
adjusting the second pedestal between the second distance and a fourth distance; and
for the second part of the deposition process, simultaneously generating in each of Z deposition cycles:
the third plasma at the first station while the first pedestal is separated by the third distance from the first showerhead, thereby depositing the third layer of material onto the first substrate, and
the fourth plasma at the second station while the second pedestal is separated by the fourth distance from the second showerhead, thereby depositing the fourth layer of material onto the second substrate, wherein each of the Z deposition cycles includes igniting and extinguishing the third plasma and the fourth plasma.

9. The method of claim 5, wherein each N deposition cycle at the first station and the second station comprises:
(i) adsorbing a film precursor onto the substrate at that station such that the precursor forms an adsorption-limited layer on the substrate;
(ii) removing at least some unadsorbed film precursor from a volume surrounding the adsorbed film precursor;
(iii) reacting adsorbed film precursor, after removing unadsorbed film precursor in (ii), by generating the plasma at that station to form a respective layer of material on the substrate at that station; and
(iv) removing desorbed film precursor and/or reaction by-product from a volume surrounding the respective layer of material when present after reacting the adsorbed film precursor in (iii).

10. The method of claim 9, further comprising:
adjusting the first pedestal from the first distance to a third distance; and
adjusting the second pedestal from the second distance to a fourth distance, wherein:
the first pedestal is at the first distance and the second pedestal is at the second distance for (iii) of each cycle, and
the first pedestal is at the third distance and the second pedestal is at the fourth distance for one or more of (i), (ii), or (iv) of each cycle.

11. The method of claim 1, further comprising providing a third substrate onto a third pedestal of a third station of the multi-station deposition apparatus, wherein:
the first part of the deposition process further comprises simultaneously generating a fifth plasma at the third station while the third pedestal is separated by a third distance from a third showerhead of the third station, thereby depositing the third layer of material onto the third substrate, and
the third distance is different than the first distance and the second distance.

12. The method of claim 11, further comprising:
for the second part of the deposition process, simultaneously generating:
the third plasma at the first station while the first pedestal is separated by a fourth distance from the first showerhead, thereby depositing a fifth layer of material onto the first substrate,
the fourth plasma at the second station while the second pedestal is separated by the fourth distance from the second showerhead, thereby depositing a sixth layer of material onto the second substrate, and
a sixth plasma at the third station while simultaneously generating the third plasma and the fourth plasma, and while the third pedestal is separated by the fourth distance from the third showerhead, thereby depositing a seventh layer of material onto the third substrate.

13. The method of claim 1, wherein:
the first plasma has a first value of a plasma characteristic, and
the second plasma has a second value of the plasma characteristic different than the first value.

14. The method of claim 13, wherein the plasma characteristic comprises a plasma power.

15. The method of claim 1, wherein, subsequent to the second part of the deposition process:
the value of the property associated with the second layer of material on the second substrate is substantially the same as the value of the property associated with the first layer of material on the first substrate.

16. The method of claim 15, wherein:
for the first part of the deposition process, the first distance and the second distance are substantially the same; and
the adjusting of the at least one of the first distance or the second distance comprises adjusting the first distance to a third distance and maintaining the second distance equivalent to the first distance.

17. The method of claim 1, wherein the property is selected from the group consisting of a wet etch rate, a dry etch rate, a composition, the thickness of the material, a density, an amount of cross-linking, a chemistry, a reaction completion, a stress, a refractive index, a dielectric constant, a hardness, an etch selectivity, a stability, and a hermeticity.

18. The method of claim 1, further comprising:
providing, before providing the first substrate and the second substrate, a third substrate onto the first pedestal;
providing, before providing the first substrate and the second substrate, a fourth substrate onto the second pedestal; and
for a second deposition process, simultaneously generating:
a fifth plasma at the first station while the first pedestal is separated by a third distance from the first showerhead, thereby depositing the third layer of material onto the third substrate, and
a sixth plasma at the second station while the second pedestal is separated by the first distance from the second showerhead, thereby depositing the fourth layer of material onto the fourth substrate, wherein a first nonuniformity between the property associated with the first layer of material on the first substrate and the property associated with the second layer of material on the second substrate is smaller than a second nonuniformity between a property associated with the third layer of material on the third substrate and a property associated with the fourth layer of material on the fourth substrate.

19. The method of claim 1, wherein:
the first pedestal applies a chucking force on the first substrate during the first part of the deposition process, and
the second pedestal applies a chucking force on the second substrate during the first part of the deposition process.

20. The method of claim 1, wherein:
subsequent to the first part of the deposition process:
the value of the thickness associated with the first layer of material on the first substrate comprises a value of the property of a first portion of the first layer of material on the first substrate; and
the value of the thickness associated with the second layer of material on the second substrate comprises a value of the thickness of a first portion of the second layer of material on the second substrate, the first portion of the second layer of material on the second substrate corresponding to the first portion of the first layer of material on the first substrate; and
subsequent to the second part of the deposition process:
the value of the thickness associated with the first layer of material on the first substrate comprises a value of the property thickness of a second portion of the first layer of material on the first substrate; and
the value of the thickness associated with the second layer of material on the second substrate comprises a value of the thickness of a second portion of the second layer of material on the second substrate, the second portion of the second layer of material on the second substrate corresponding to the second portion of the first layer of material on the first substrate.

21. The method of claim 1, wherein:
the property further comprises a wet etch rate; and
the calibration data comprises a relationship between wet etch rates and distances between the showerhead and the pedestal.

22. The method of claim 21, wherein:
subsequent to the first part of the deposition process:
the property further comprises a wet etch rate; and
the value of the wet etch rate associated with the first layer of material on the first substrate and the value of the wet etch rate associated with the second layer of material on the second substrate are different by a first wet etch rate amount; and
subsequent to the second part of the deposition process:
the value of the wet etch rate associated with the first layer of material on the first substrate and the value of the wet etch rate associated with the second layer of material on the second substrate are different by a second wet etch rate amount that is less than the first wet etch rate amount.

23. The method of claim 1, wherein the calibration data comprises a relationship between wet etch rates and distances between the showerhead and the pedestal, a relationship between thicknesses of the material and the distances between the showerhead and the pedestal, or a combination thereof.

24. The method of claim 23, wherein the relationship between the wet etch rates and the distances between the showerhead and the pedestal comprises an inverse correlation, the relationship between the thicknesses of the material and the distances between the showerhead and the pedestal comprises a direct correlation.

* * * * *